(12) United States Patent
Lear et al.

(10) Patent No.: US 12,230,895 B2
(45) Date of Patent: Feb. 18, 2025

(54) REACTANCE CANCELLING RADIO FREQUENCY CIRCUIT ARRAY

(71) Applicant: Qorvo US, Inc., Greensboro, NC (US)

(72) Inventors: Kelly M. Lear, Longwood, FL (US); Nikolaus Klemmer, Dallas, TX (US); Jeffery Galipeau, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/312,083

(22) Filed: May 4, 2023

(65) Prior Publication Data
US 2023/0318179 A1 Oct. 5, 2023

Related U.S. Application Data

(62) Division of application No. 17/551,603, filed on Dec. 15, 2021, now Pat. No. 11,705,633.

(51) Int. Cl.
*H01Q 5/314* (2015.01)
*H03F 1/56* (2006.01)

(52) U.S. Cl.
CPC ............ *H01Q 5/314* (2015.01); *H03F 1/565* (2013.01)

(58) Field of Classification Search
CPC ............ H01Q 21/00; H01Q 1/52; H01Q 1/50; H01Q 5/31; H01Q 5/314; H01Q 5/335;
(Continued)

(56) References Cited

U.S. PATENT DOCUMENTS 6,982,609 B1 * 1/2006 McKay .................. H03F 3/60
336/232
9,214,721 B2 12/2015 Israel et al.
(Continued)

FOREIGN PATENT DOCUMENTS

| JP | H07226632 A | 8/1995 |
| KR | 20210115855 A | 9/2021 |
| WO | 2010015365 A2 | 2/2010 |

OTHER PUBLICATIONS

Bert, A.G. et al., "The Traveling Wave Power Divider/Combiner," 1980 10th European Microwave Conference, Sep. 8-12, 1980, Warszawa, Poland, IEEE.
(Continued)

*Primary Examiner* — Tho G Phan
(74) *Attorney, Agent, or Firm* — Withrow & Terranova, P.L.L.C.

(57) ABSTRACT

A reactance cancelling radio frequency (RF) circuit array is disclosed. The reactance cancelling RF circuit array includes multiple RF circuits each coupled to one or two adjacent RF circuits by one or two pairs of coupling mediums each having a respective length less than one-quarter wavelength. In one aspect, an RF input signal is first split across the RF circuits and then combined to form an RF output signal. As a result, each RF circuit requires a lower power handling capability to process a portion of the RF input signal. In another aspect, each pair of the coupling mediums can cause reactance cancellation in each reactance-cancelling pair of the RF circuits. By coupling the RF circuits via the coupling mediums and enabling splitting-combining among the RF circuits, it is possible to miniaturize the reactance cancelling RF circuit array for improved performance across a wide frequency spectrum.

6 Claims, 20 Drawing Sheets

(58) Field of Classification Search
CPC .......... H01Q 5/364; H03F 1/56; H03F 1/565; H03F 1/025; H03F 1/0255; H03F 3/21
See application file for complete search history.

(56) References Cited

U.S. PATENT DOCUMENTS

| | | | |
|---|---|---|---|
| 9,882,535 | B2 | 1/2018 | Jang et al. |
| 10,135,123 | B1* | 11/2018 | Arnitz .................... H01Q 1/247 |
| 10,389,021 | B1 | 8/2019 | Thakur |
| 11,437,971 | B2* | 9/2022 | Yu ........................ H03H 7/1775 |
| 2016/0204520 | A1 | 7/2016 | Dong et al. |
| 2017/0244369 | A1 | 8/2017 | Mimis et al. |
| 2019/0158053 | A1 | 5/2019 | Yoon |
| 2021/0226594 | A1 | 7/2021 | Su et al. |
| 2022/0029285 | A1* | 1/2022 | Svendsen ............... H01Q 1/525 |
| 2022/0085776 | A1 | 3/2022 | Cao |
| 2023/0187826 | A1 | 6/2023 | Lear et al. |

OTHER PUBLICATIONS

Jiang, X. et al., "A Class-B Push-Pull Power Amplifier Based on an Extended Resonance Technique," IEEE Microwave and Wireless Components Letters, vol. 13, Issue 12, Dec. 2003, IEEE, pp. 550-552.

Kurokawa, K. et al., "The Single-Cavity Multiple Device Oscillator," IEEE Transactions on Microwave Theory and Techniques, vol. 19, Issue 10, Oct. 1971, IEEE, pp. 793-801.

Mortazawi, A. et al., "A Nine-MESFET Two-Dimensional Power-Combining Array Employing an Extended Resonance Technique," IEEE Microwave and Guided Wave Letters, vol. 3, Issue 7, Jul. 1993, IEEE, pp. 214-216.

Mortazawi, A. et al., "A Periodic Planar Gunn Diode Power Combining Oscillator," IEEE Transactions on Microwave Theory and Techniques, vol. 38, Issue 1, Jan. 1990, IEEE, pp. 86-87.

Mortazawi, A. et al., "Multiple Element Oscillators Utilizing a New Power Combining Technique," IEEE Transactions on Microwave Theory and Techniques, vol. 40, Issue 12, Dec. 1992, IEEE, pp. 2397-2402.

Rucker, C.T. et al., "A Multiple-Diode High-Average-Power Avalanche Diode Oscillator," IEEE Transactions on Microwave Theory and Techniques, vol. 17, Issue 12, Dec. 1969, IEEE, pp. 1156-1158.

Notice of Allowance for U.S. Appl. No. 17/551,603, mailed Feb. 16, 2023, 8 pages.

Extended European Search Report for European Patent Application No. 22210228.7, mailed May 22, 2023, 9 pages.

* cited by examiner

| | |
|---|---|
| 1 & 2 | INDUCTIVE REACTANCE REGION |
| 3 & 4 | CAPACITIVE REACTANCE REGION |
| 2 & 3 | HIGH IMPEDANCE REGION |
| 1 & 4 | LOW IMPEDANCE REGION |

REACTANCE CANCELLING RADIO FREQUENCY CIRCUIT ARRAY

RELATED APPLICATIONS

This application is a divisional of U.S. patent application Ser. No. 17/551,603, filed Dec. 15, 2021, now U.S. Pat. No. 11,705,633, issued Jul. 18, 2023, the disclosure of which is hereby incorporated herein by reference in its entirety.

FIELD OF THE DISCLOSURE

The technology of the disclosure relates generally to a reactance cancelling among multiple radio frequency (RF) circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A wireless communication device often needs to split and/or combine the RF signal(s) in various stages of signal processing. Conventional power dividers and combiners are typically made with one-quarter wavelength (¼ λ) or, sometimes, even one-half wavelength (½ λ) long transmission lines and/or lumped elements in between circuits to be split or combined. Given the inverse relationship between wavelength and frequency, the approximately ¼ λ to approximately ½ λ long transmission lines can lead to a significant increase in footprint when the RF signal(s) is modulated in lower frequencies (e.g., FR1). The approximately ¼ λ to approximately ½ λ long lumped elements, on the other hand, can cause excessively large reactance and increased cost. Further, the ¼ λ to ½ λ long transmission lines and/or lumped elements can also limit operating bandwidth of the power divider and combiner. It is thus desirable to miniaturize the power divider and combiner concurrent to reducing reactance and cost.

SUMMARY

Aspects disclosed in the detailed description include a reactance cancelling radio frequency (RF) circuit array. The reactance cancelling RF circuit array includes multiple RF circuits each coupled to one or two adjacent RF circuits by one or more coupling mediums each having a respective length less than one-quarter wavelength. In one aspect, an RF input signal is first split across the RF circuits and then combined to form an RF output signal. As a result, each RF circuit requires a lower power handling capability to process a portion of the RF input signal. In another aspect, each group of the coupling mediums (e.g., lumped elements and/or transmission lines) can be individually or collectively optimized to cause reactance cancellation in each reactance-cancelling pair of the RF circuits. By coupling the RF circuits via the coupling mediums and enabling splitting-combining among the RF circuits, it is possible to miniaturize the reactance cancelling RF circuit array for improved performance across a wide frequency spectrum.

In one aspect, a reactance cancelling RF circuit array is provided. The reactance cancelling RF circuit array includes at least one input medium. The input medium includes multiple first coupling mediums. The reactance cancelling RF circuit array also includes at least one output medium. The output medium includes multiple second coupling mediums. The reactance cancelling RF circuit array also includes multiple RF circuits provided between the input medium and the output medium. The multiple RF circuits are each coupled to a respective one or two adjacent RF circuits among the multiple RF circuits via a respective one or two of the multiple first coupling mediums and a respective one or two of the multiple second coupling mediums to thereby divide the multiple RF circuits into one or more reactance-cancelling pairs each comprising a pair of the multiple RF circuits. The multiple first coupling mediums and the multiple second coupling mediums are configured to cause a reactance cancellation between the pair of the multiple RF circuits in each of the one or more reactance-cancelling pairs.

In another aspect, a reactance cancelling circuit array network is provided. The reactance cancelling circuit array network includes multiple input coupling elements. The reactance cancelling circuit array network also includes multiple output coupling elements. The reactance cancelling circuit array network also includes multiple reactance cancelling RF circuit arrays each coupled to a respective one or two adjacent reactance cancelling RF circuit arrays among the multiple reactance cancelling circuit arrays via a respective one or two of the multiple input coupling elements and a respective one or two of the multiple output coupling elements. Each of the multiple reactance cancelling RF circuit arrays includes at least one input medium. The input medium includes multiple first coupling mediums. Each of the multiple reactance cancelling RF circuit arrays also includes at least one output medium. The output medium includes multiple second coupling mediums. Each of the multiple reactance cancelling RF circuit arrays also includes multiple RF circuits provided between the input medium and the output medium. The multiple RF circuits are each coupled to a respective one or two adjacent RF circuits among the multiple RF circuits via a respective one or two of the multiple first coupling mediums and a respective one or two of the multiple second coupling mediums to thereby divide the multiple RF circuits into one or more reactance-cancelling pairs each comprising a pair of the multiple RF circuits. The multiple first coupling mediums and the multiple second coupling mediums are configured to cause a reactance cancellation between the pair of the multiple RF circuits in each of the one or more reactance-cancelling pairs.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 1:
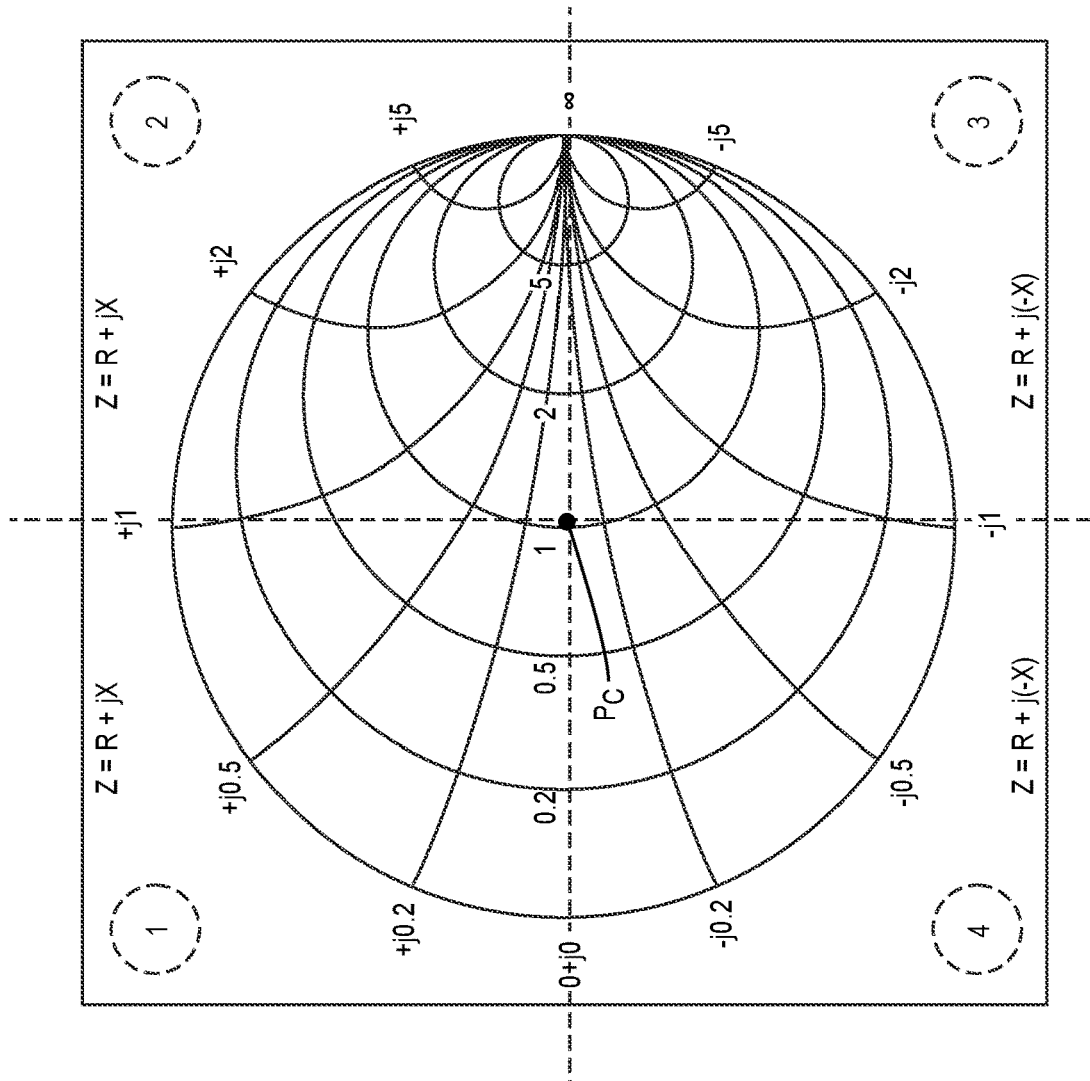
FIG. 1 is a graphic diagram providing an exemplary illustration of the well-known Smith Chart.
Figure 2:
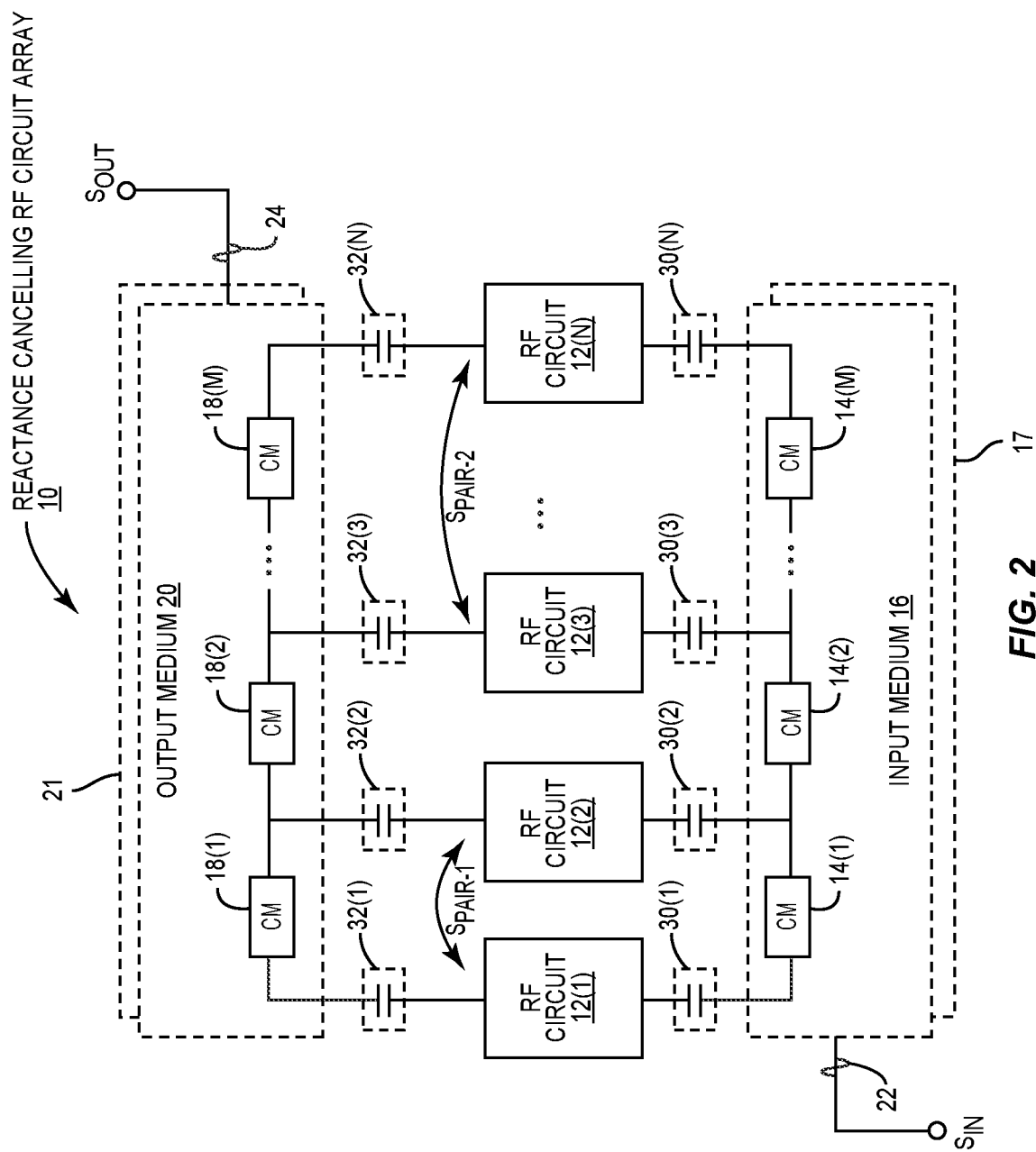
FIG. 2 is a schematic diagram of an exemplary reactance cancelling RF circuit array that can be configured to enable various embodiments of the present disclosure to enable splitting-combining and reactance cancelling operations.
Figure 3A:
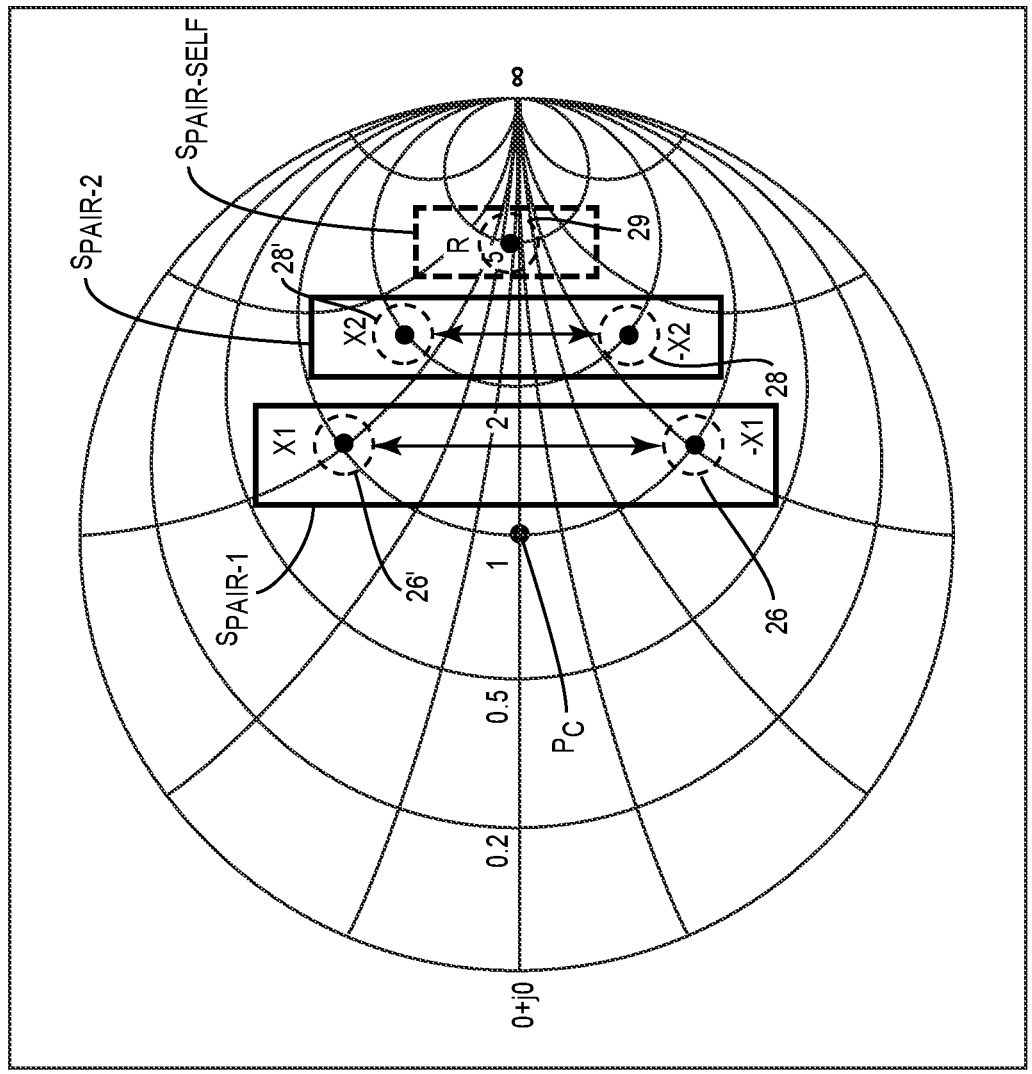
FIG. 3A is a graphic diagram providing an exemplary illustration as to how reactance cancellation can be achieved between a pair of the RF circuits in a reactance-cancelling pair.
Figure 3B:
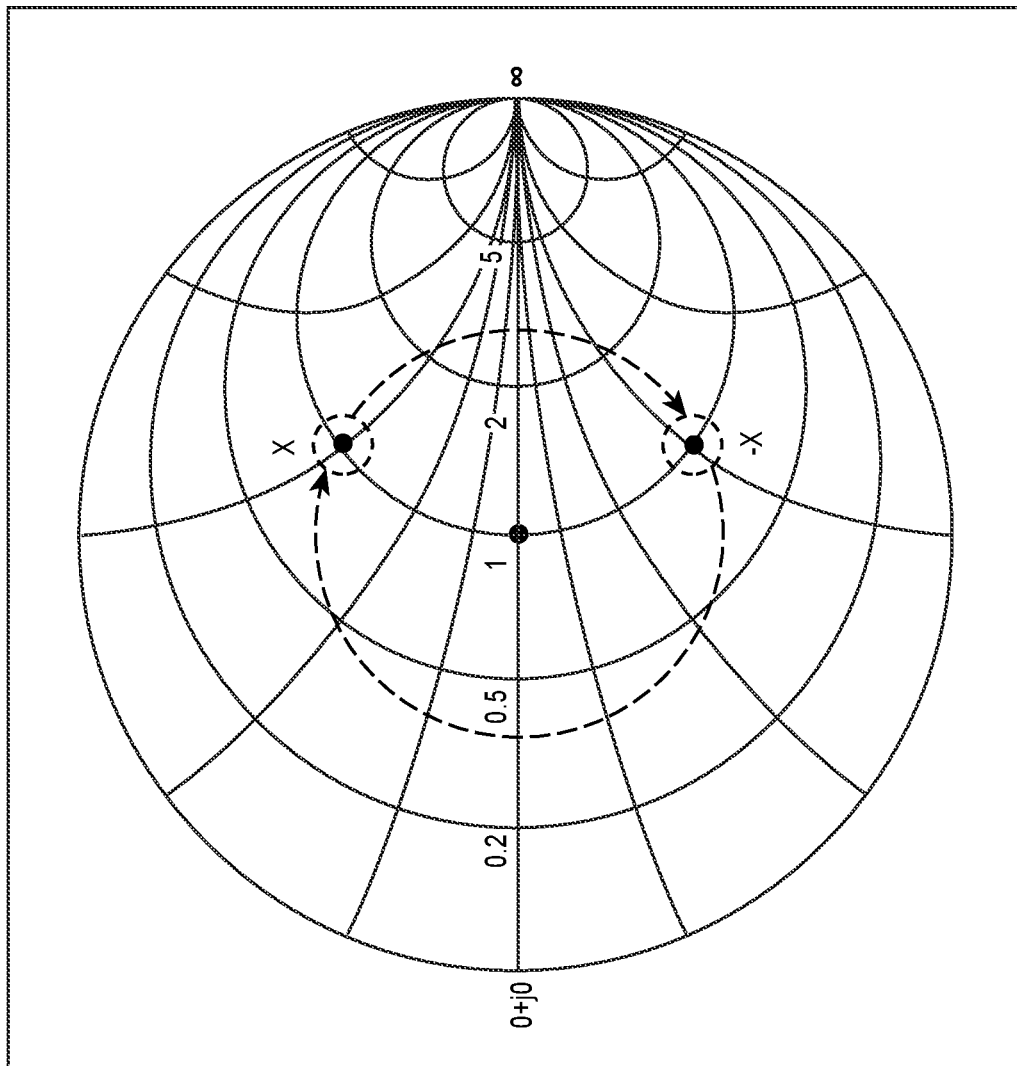
FIGS. 3B and 3C are graphic diagrams providing exemplary illustrations of conventional methods for rotating an impedance on the Smith Chart of FIG. 1.
Figure 3C:
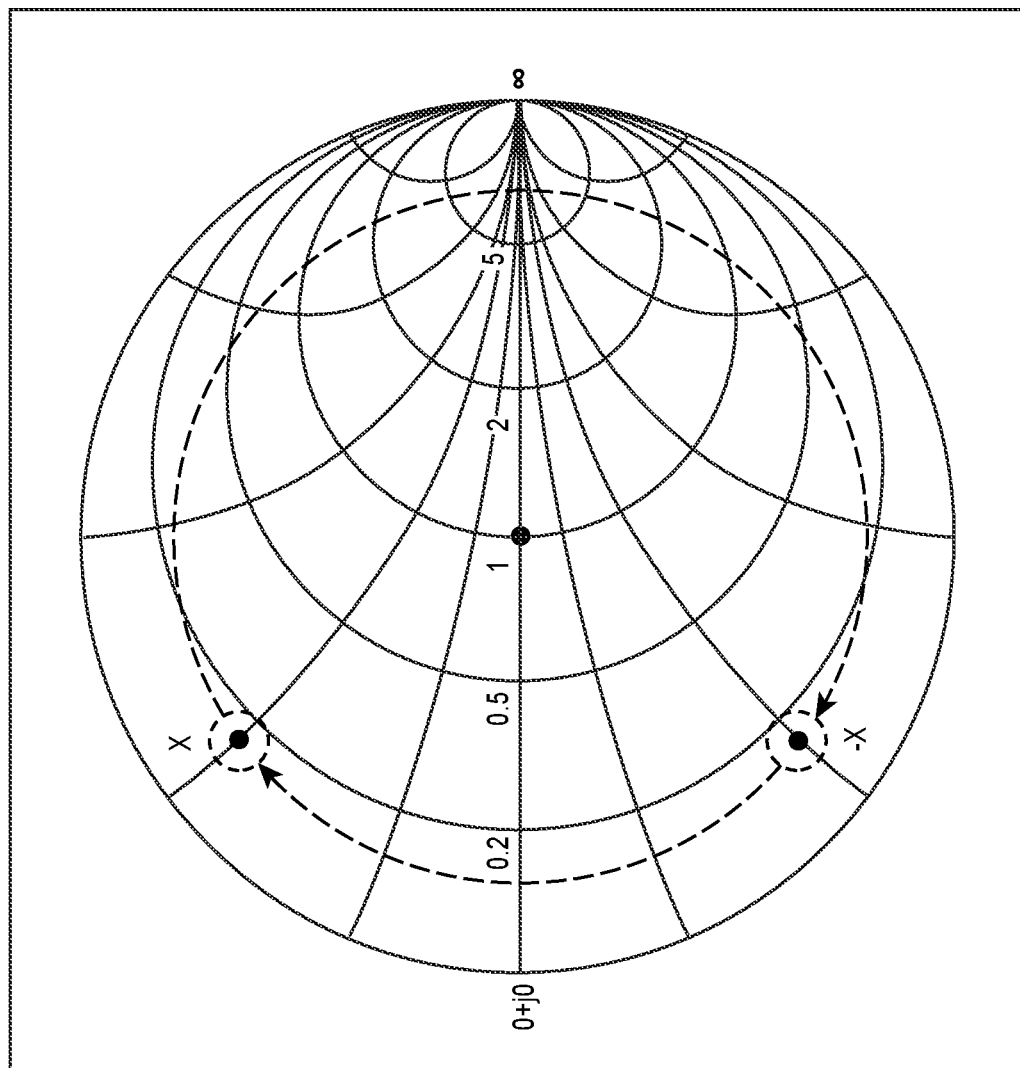
Figure 3D:
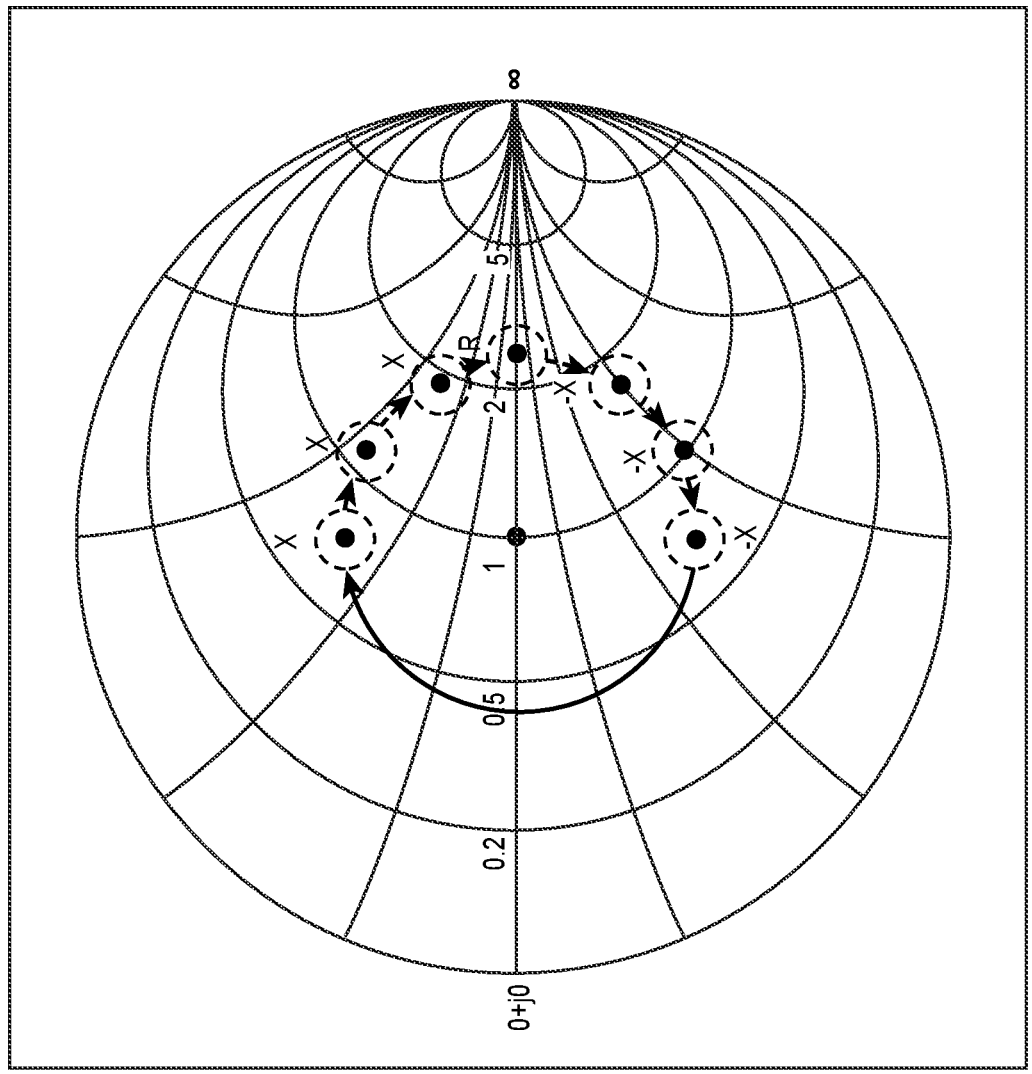
Figure 3E:
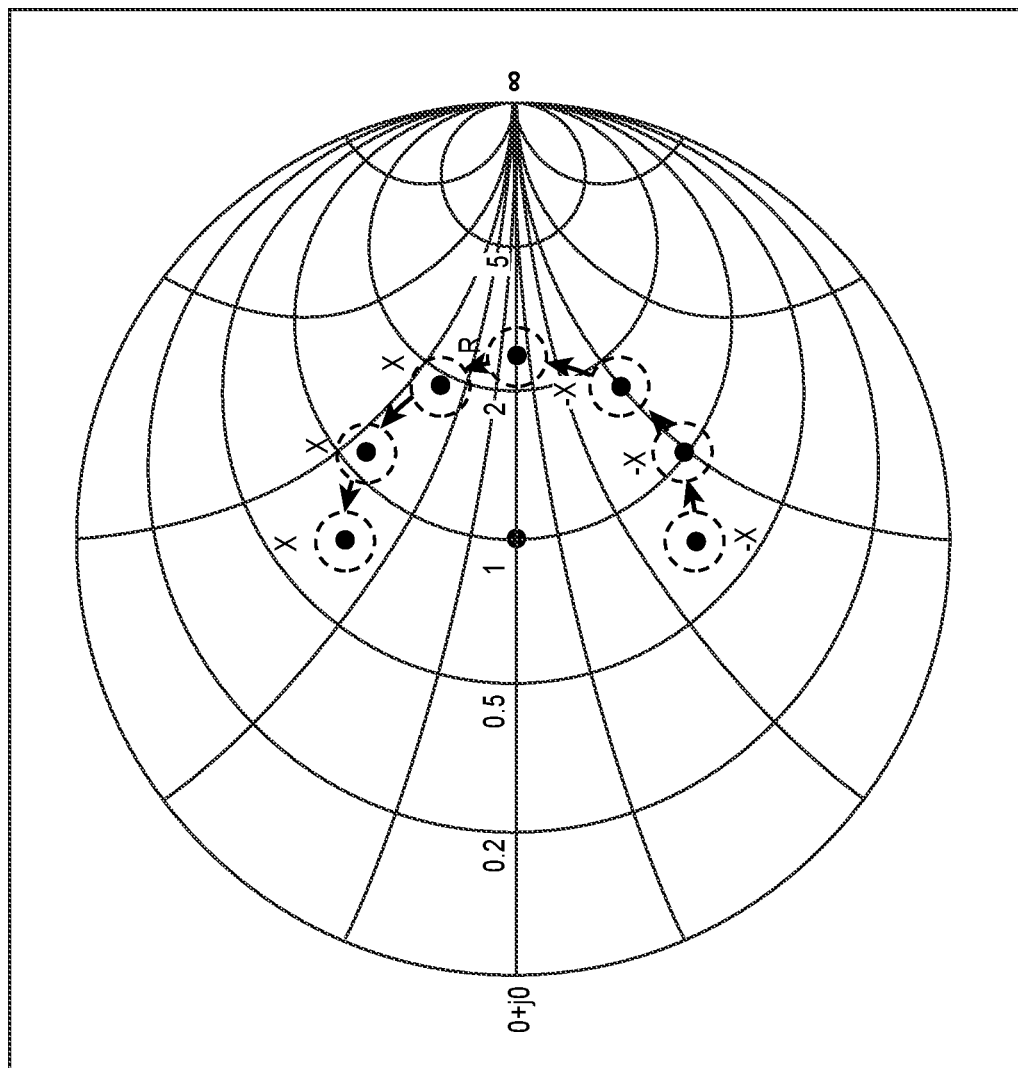
Figure 3F:
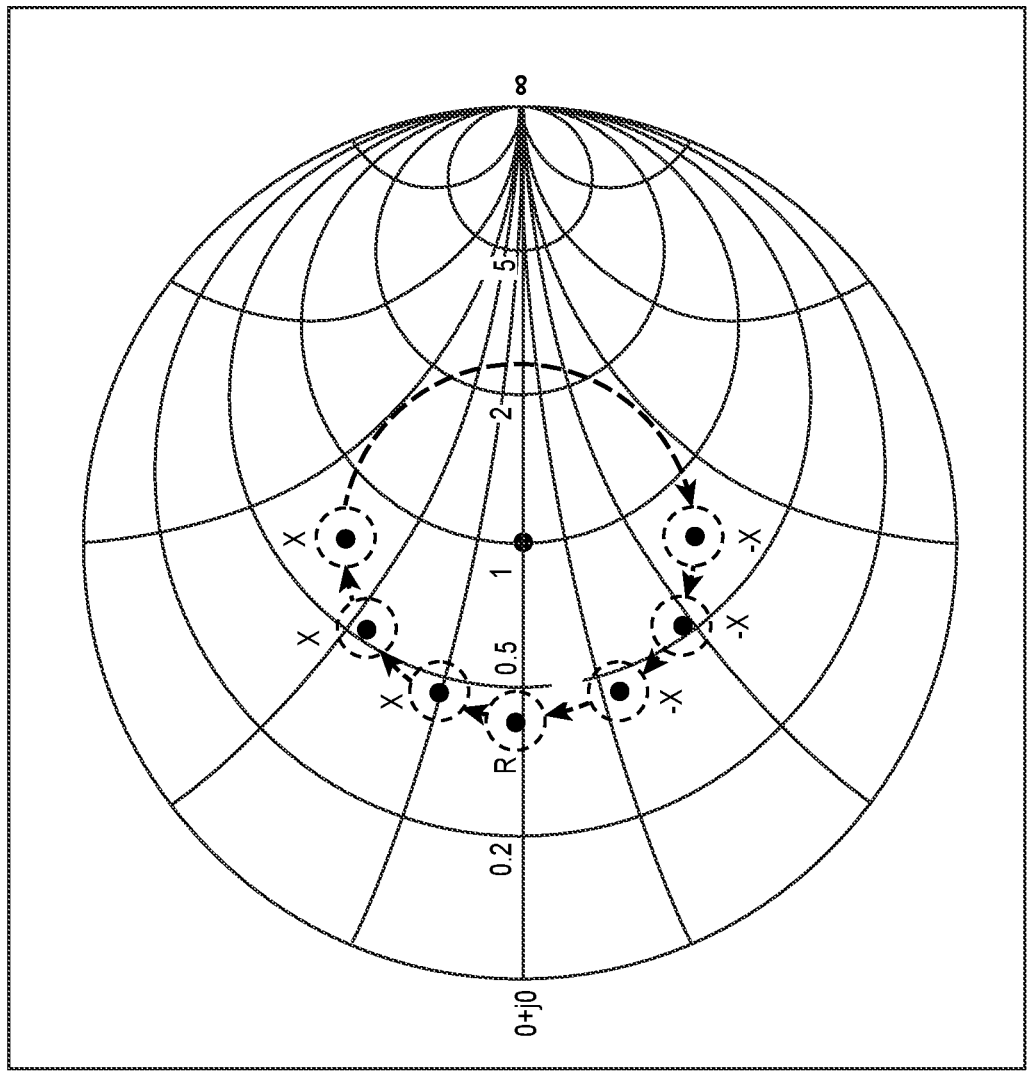
Figure 4A:
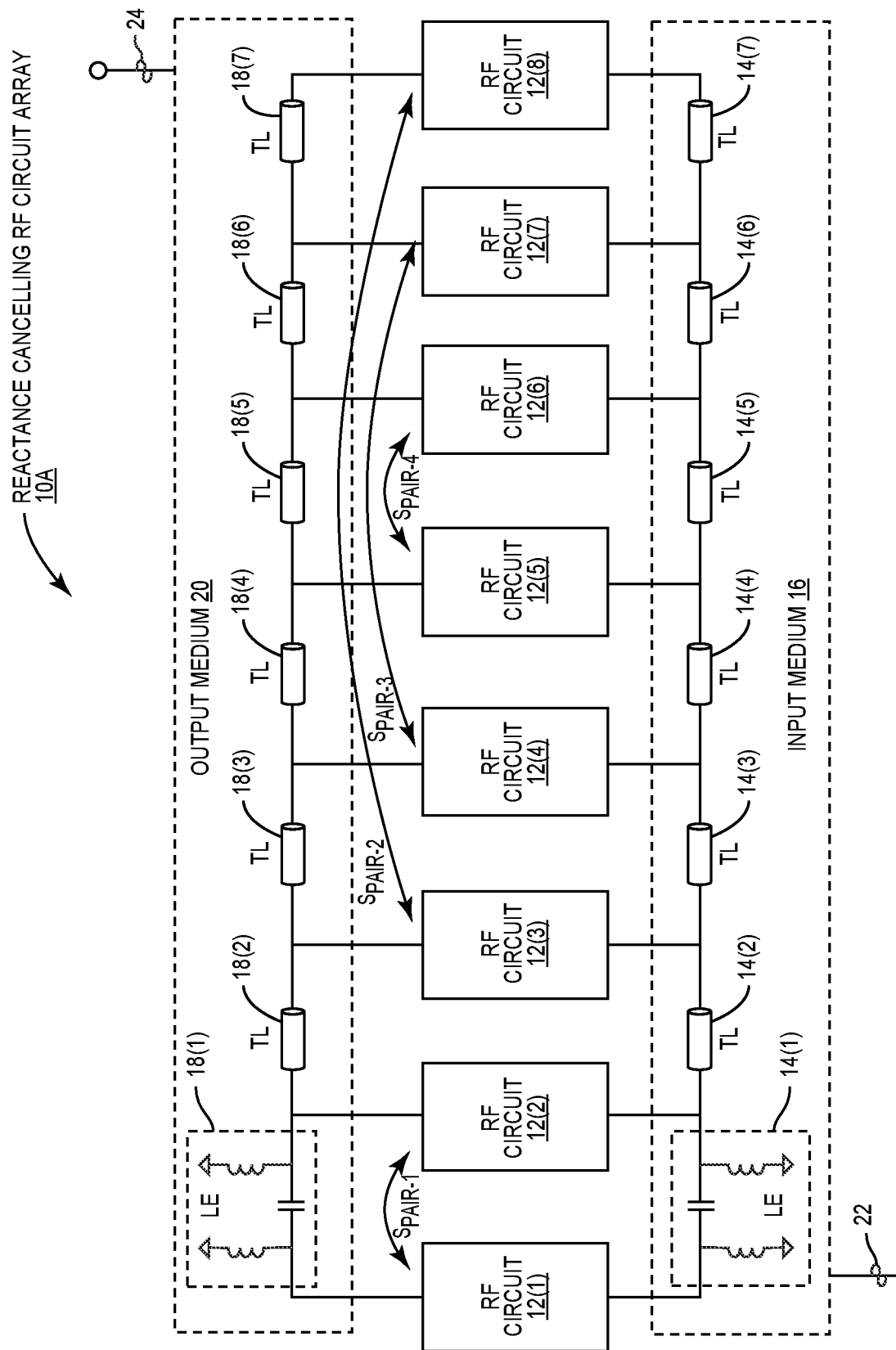
Figure 4B:
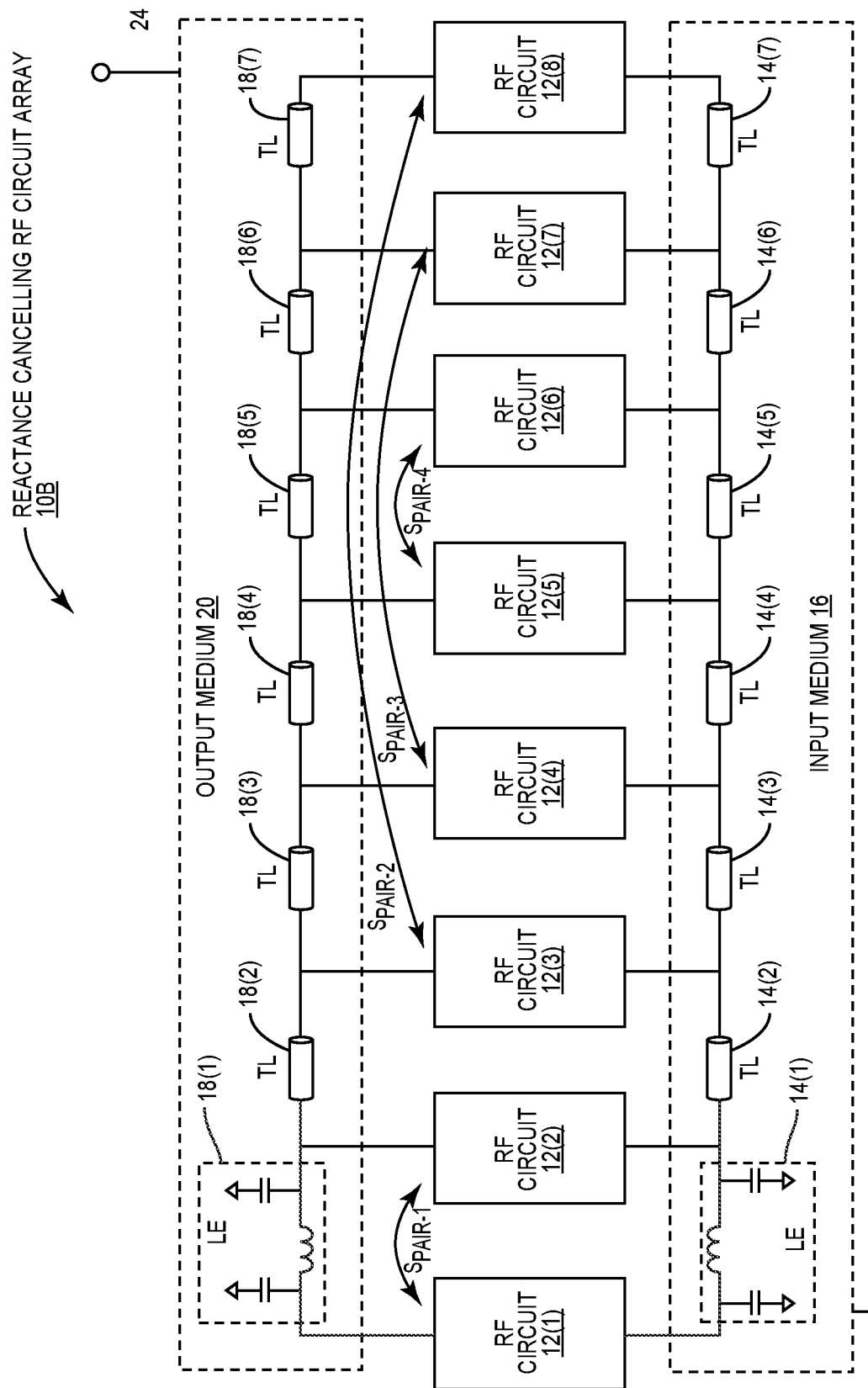
Figure 4C:
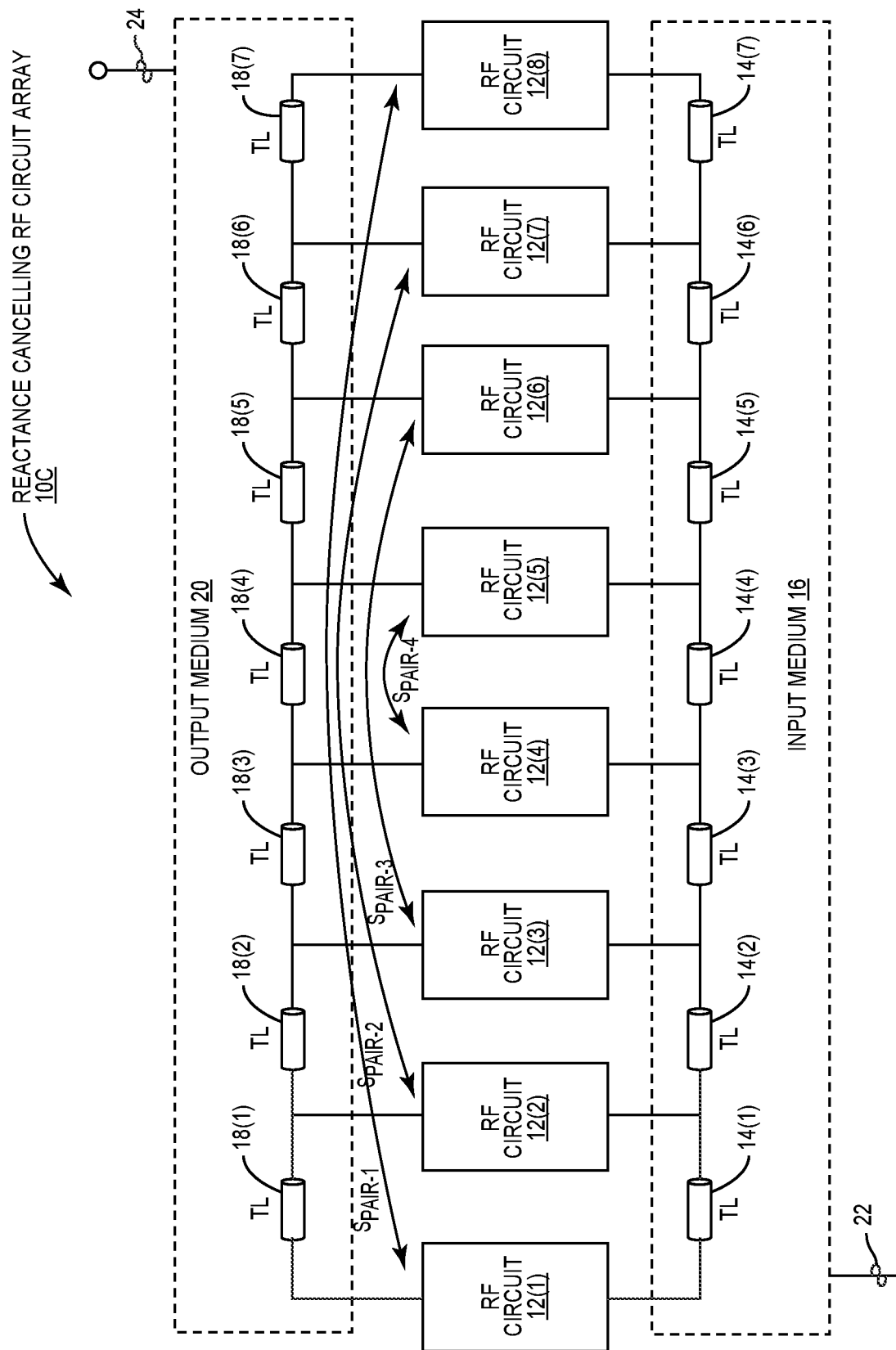
Figure 4D:
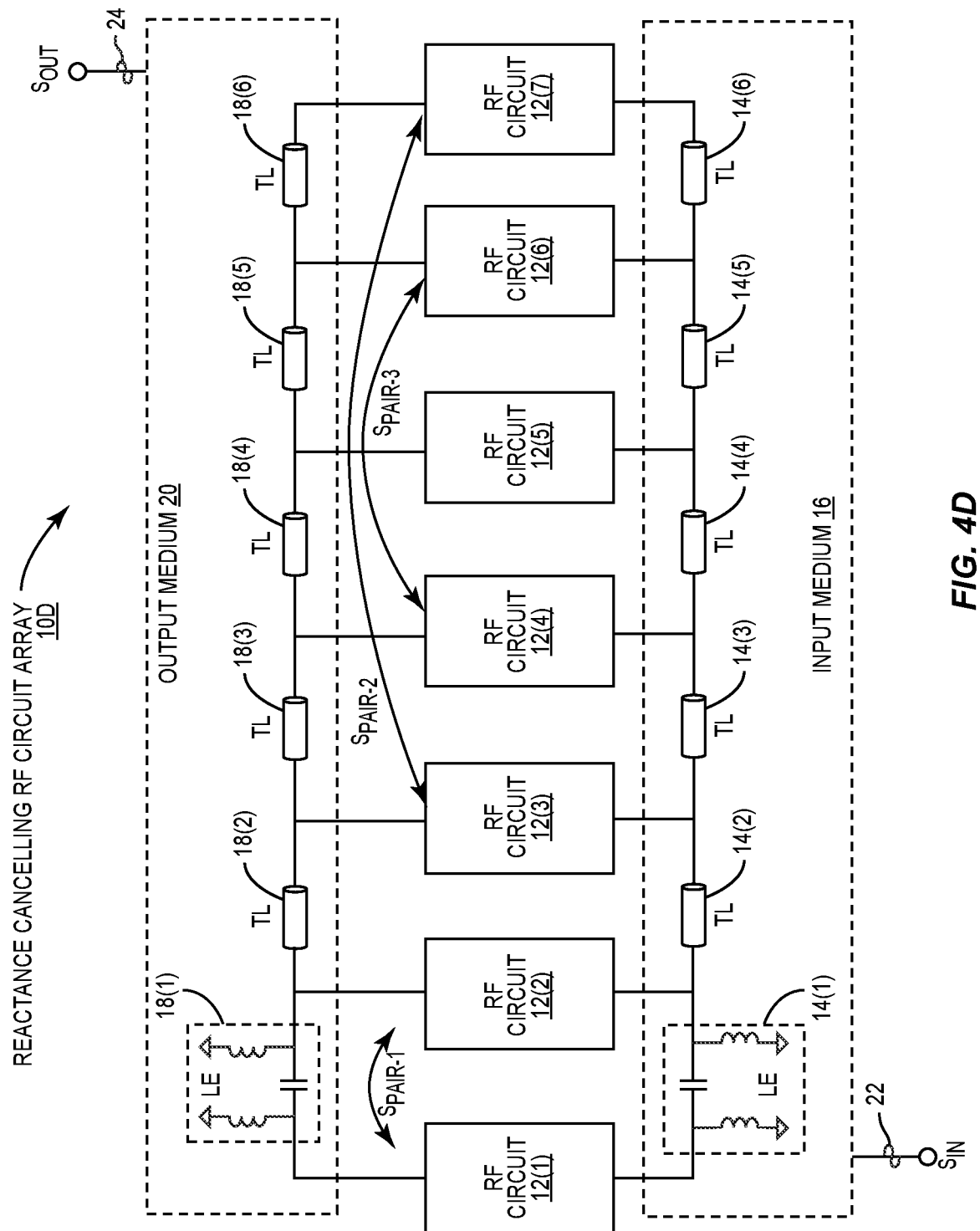
Figure 5A:
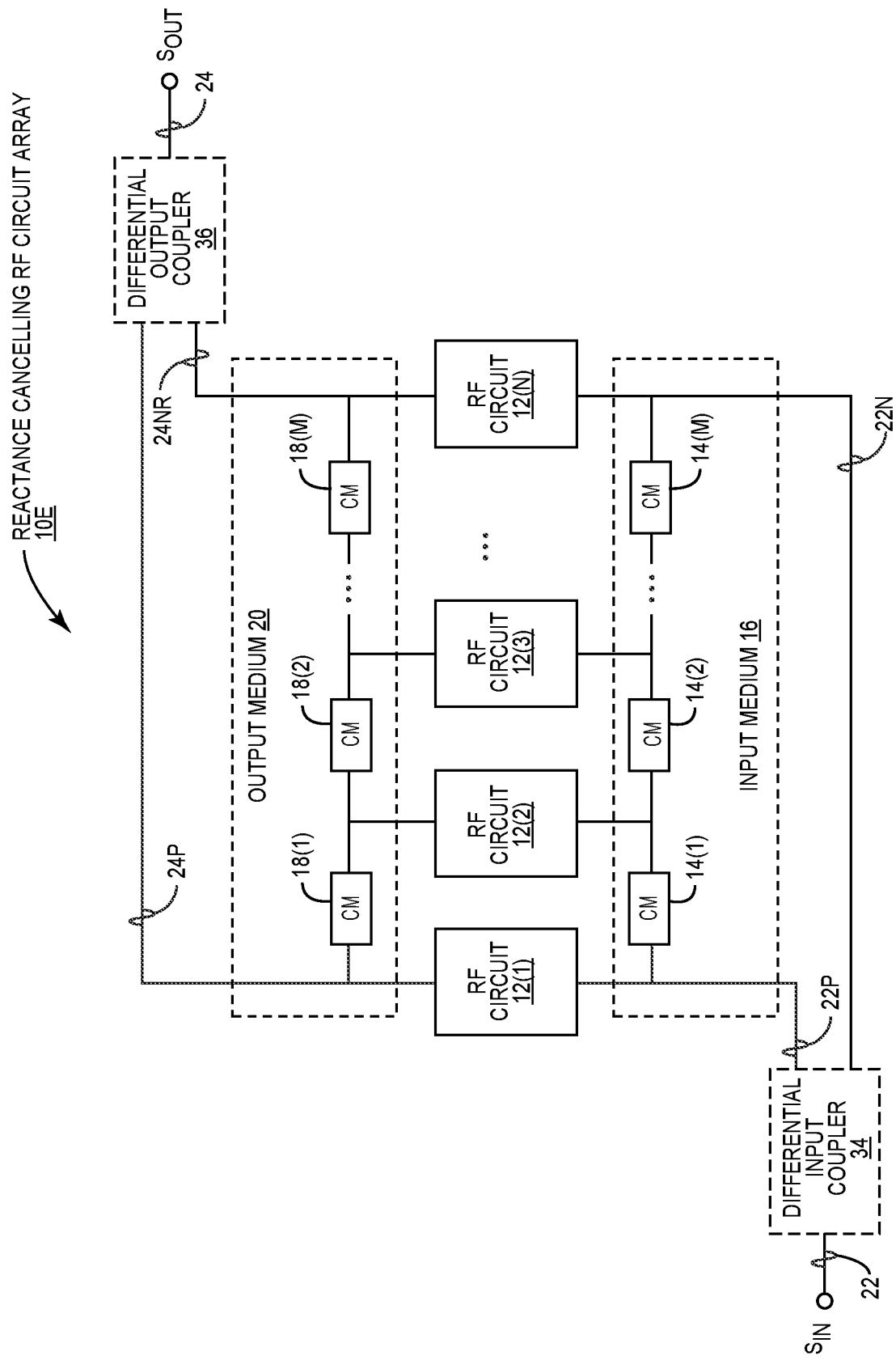
Figure 5B:
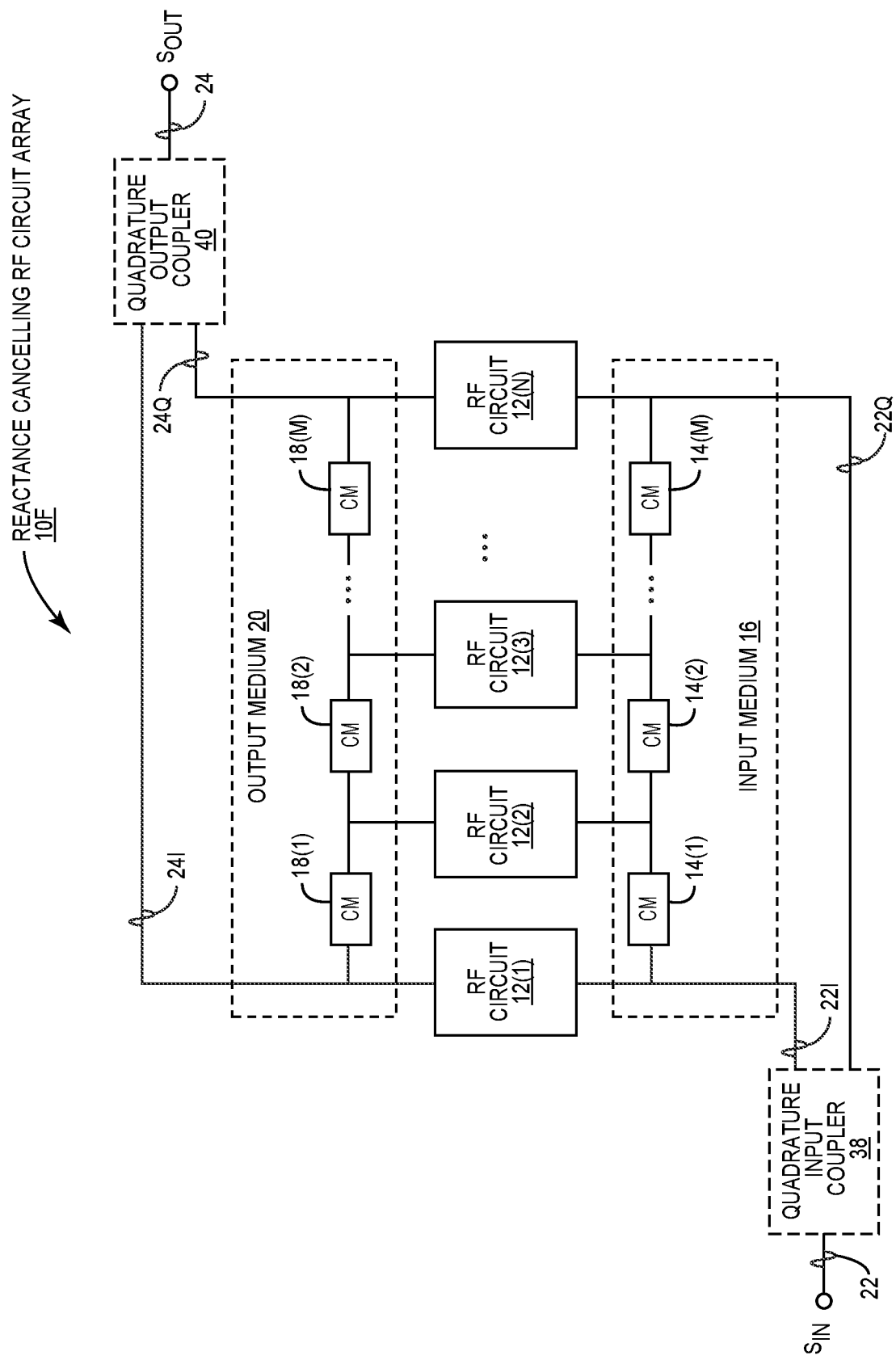
Figure 5C:
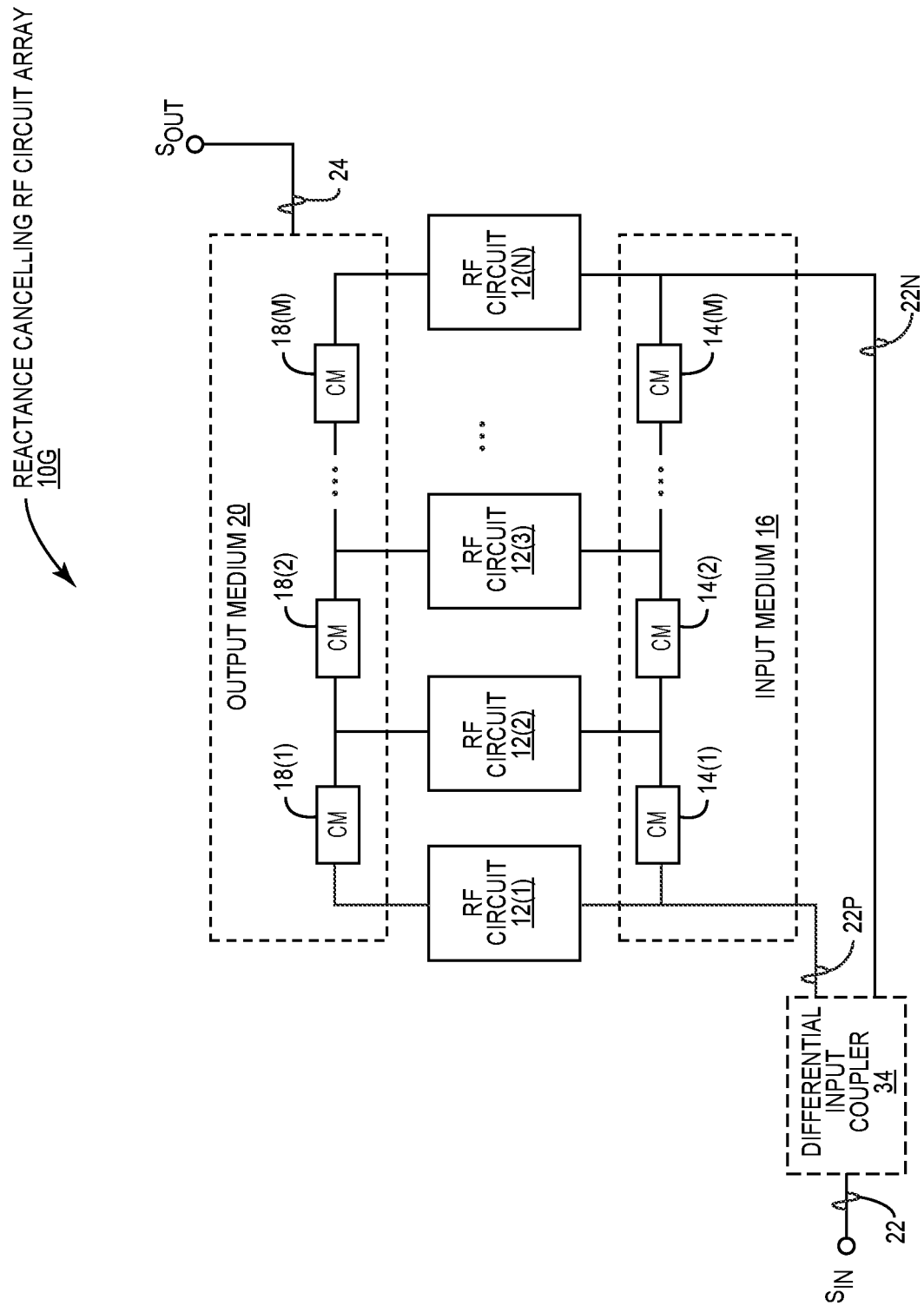
Figure 5D:
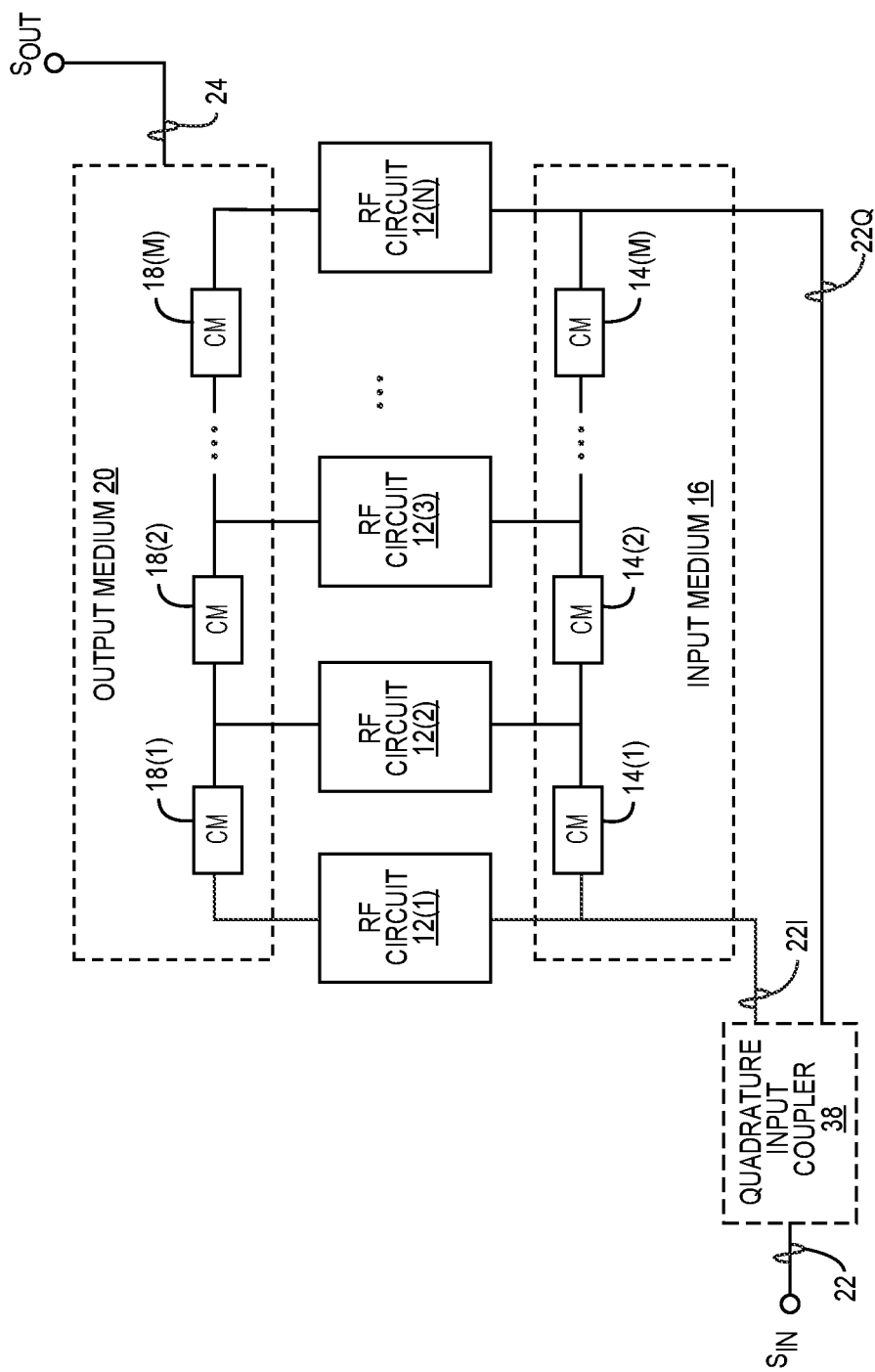
Figure 5E:
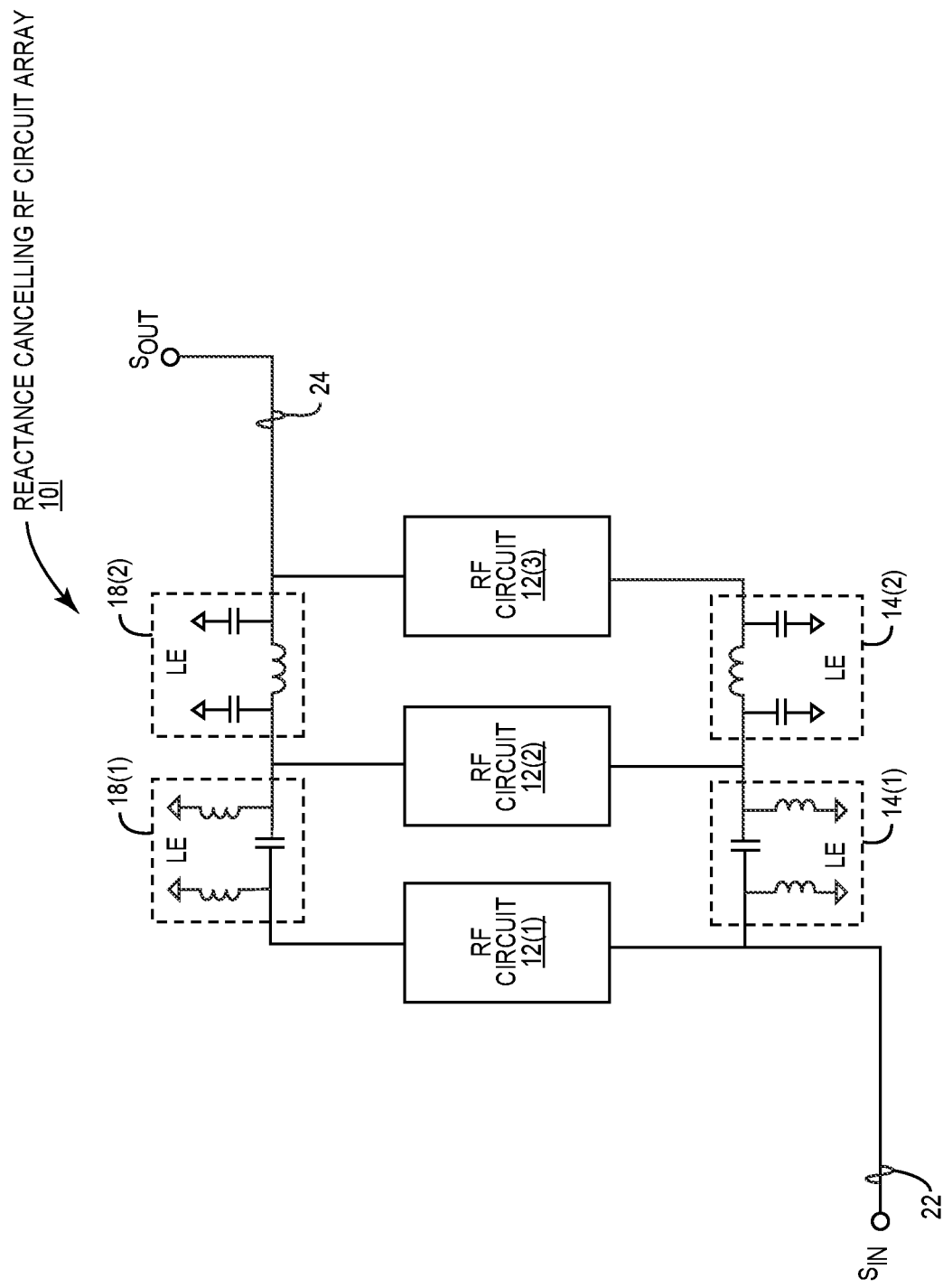
Figure 6:
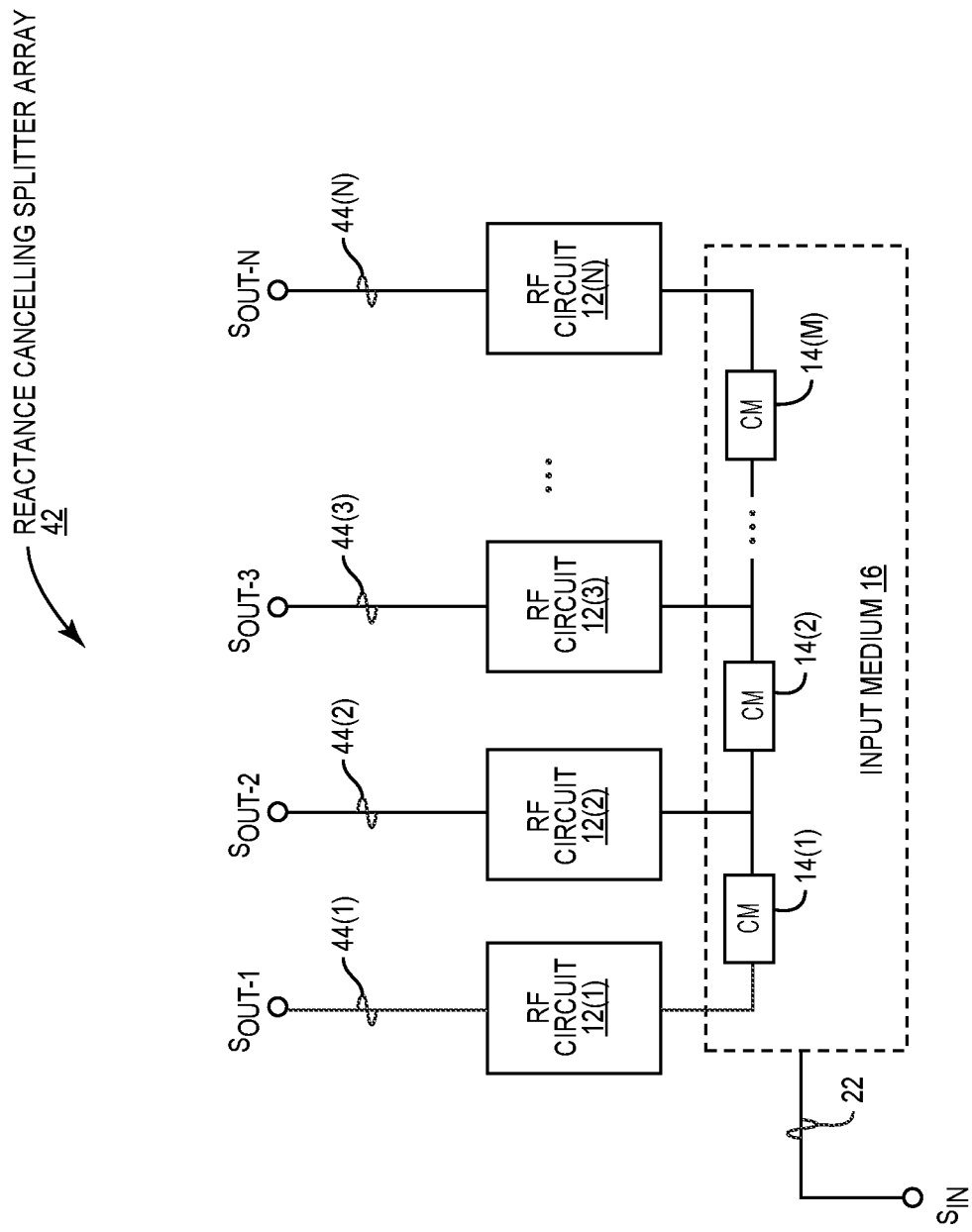
Figure 7:
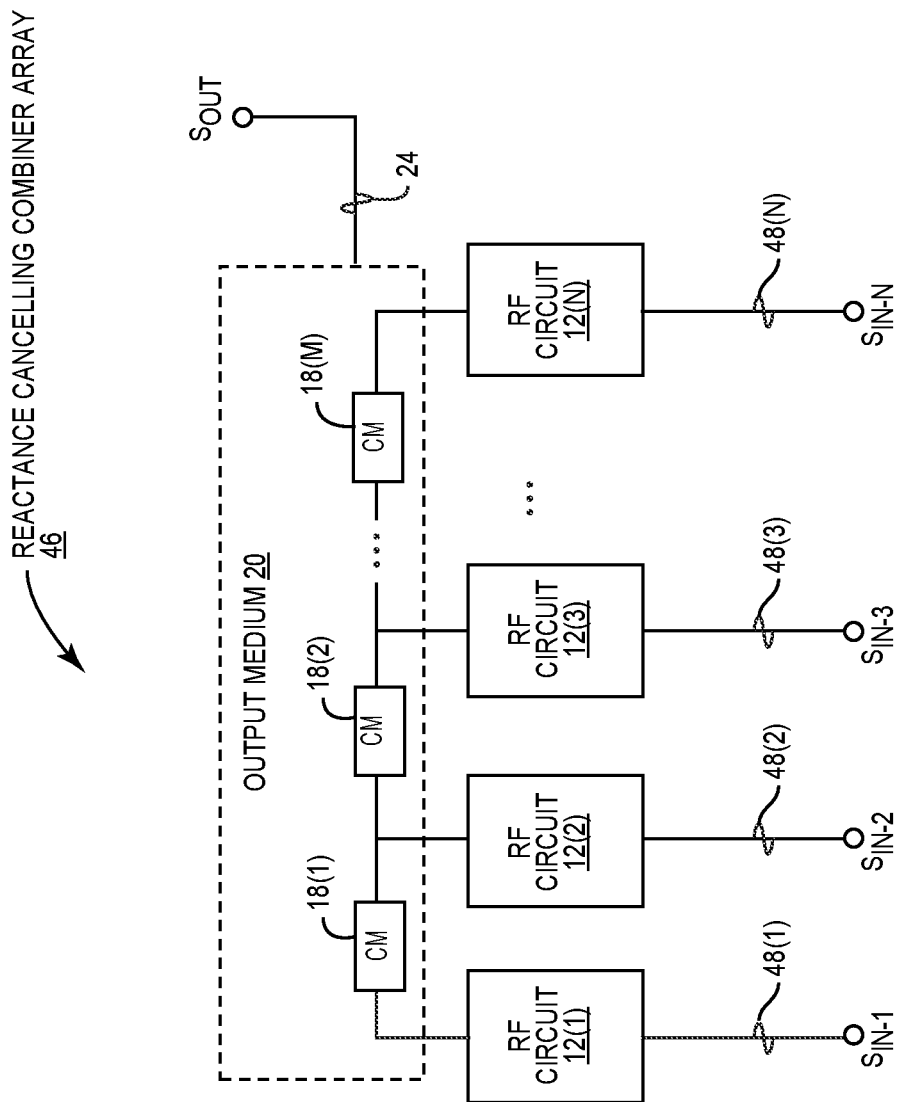
Figure 8:
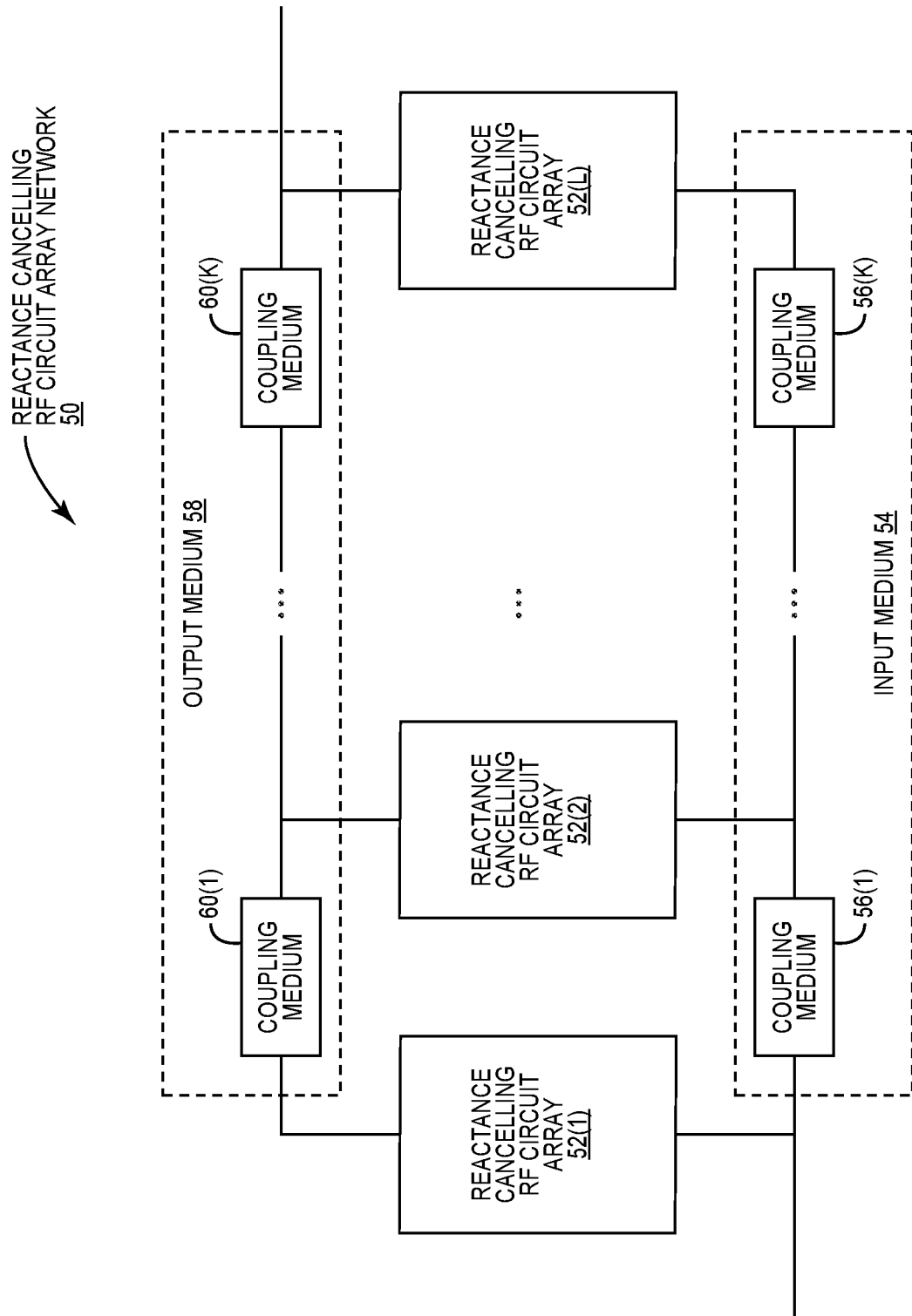

FIGS. 3D, 3E, and 3F are graphic diagrams providing exemplary illustrations of methods for rotating an impedance on the Smith Chart of FIG. 1 according to embodiments of the present disclosure;

FIG. 4A is a schematic diagram of an exemplary reactance cancelling RF circuit array 10A, which is adapted from the reactance cancelling RF circuit array of FIG. 2 according to an embodiment of the present disclosure;

FIG. 4B is a schematic diagram of an exemplary reactance cancelling RF circuit array, which is adapted from the reactance cancelling RF circuit array of FIG. 2 according to another embodiment of the present disclosure;

FIG. 4C is a schematic diagram of an exemplary reactance cancelling RF circuit array, which is adapted from the reactance cancelling RF circuit array of FIG. 2 according to another embodiment of the present disclosure;

FIG. 4D is a schematic diagram of an exemplary reactance cancelling RF circuit array, which is adapted from the reactance cancelling RF circuit array of FIG. 2 according to another embodiment of the present disclosure;

FIG. 5A is a schematic diagram of an exemplary reactance cancelling RF circuit array, which is adapted from the reactance cancelling RF circuit array of FIG. 2 according to another embodiment of the present disclosure to handle differential signals;

FIG. 5B is a schematic diagram of an exemplary reactance cancelling RF circuit array, which is adapted from the reactance cancelling RF circuit array of FIG. 2 according to another embodiment of the present disclosure to handle quadrature signals;

FIG. 5C is a schematic diagram of an exemplary reactance cancelling RF circuit array, which is adapted from the reactance cancelling RF circuit array of FIG. 5A according to another embodiment of the present disclosure to operate as a balanced-to-unbalanced (balun) device;

FIG. 5D is a schematic diagram of an exemplary reactance cancelling RF circuit array, which is adapted from the reactance cancelling RF circuit array of FIG. 5B according to another embodiment of the present disclosure to operate as a balanced-to-unbalanced (balun) device;

FIG. 5E is a schematic diagram of an exemplary reactance cancelling RF circuit array, which is adapted from the reactance cancelling RF circuit array of FIG. 2 according to another embodiment of the present disclosure to operate as an unbalanced-to-unbalanced transformer;

FIG. 6 is a schematic diagram of an exemplary reactance cancelling splitter array, which is adapted from the reactance cancelling RF circuit array of FIG. 2 in accordance with an embodiment of the present disclosure;

FIG. 7 is a schematic diagram of an exemplary reactance cancelling combiner array, which is adapted from the reactance cancelling RF circuit array of FIG. 2 in accordance with an embodiment of the present disclosure; and FIG. 8 is a schematic diagram of an exemplary reactance cancelling RF circuit array network incorporating the reactance cancelling RF circuit array of FIG. 2.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to a reactance cancelling radio frequency (RF) circuit array. The reactance cancelling RF circuit array includes multiple RF circuits each coupled to one or two adjacent RF circuits by one or more coupling mediums each having a respective length less than one-quarter wavelength. In one aspect, an RF input signal is first split across the RF circuits and then combined to form an RF output signal. As a result, each RF circuit requires a lower power handling capability to process a portion of the RF input signal. In another aspect, each pair of the coupling mediums (e.g., lumped elements and/or transmission lines) can be individually or collectively optimized to cause reactance cancellation in each reactance-cancelling pair of the RF circuits. By coupling the RF circuits via the coupling mediums and enabling splitting-combining among the RF circuits, it is possible to miniaturize the reactance cancelling RF circuit array for improved performance across a wide frequency spectrum.

Before discussing the reactance cancelling RF circuit array of the present disclosure, starting at FIG. 2, a brief discussion of the well-known Smith Chart is first provided with reference to FIG. 1 to help define some critical terminologies in the context of the present disclosure.

FIG. 1 is a graphic diagram providing an exemplary illustration of the well-known Smith Chart. In the context of the present disclosure, the Smith Chart is divided in to four quadrants 1, 2, 3, and 4. Among them, quadrants 1 and 2 represent an inductive reactance region, in which an impedance Z can be expressed as R+jX. Understandably, R represents a real resistance and X represents an inductive reactance. In contrast, quadrants 3 and 4 represent a capacitive reactance region, in which the impedance Z can be expressed as R+j(−X). Understandably, R represents the real resistance and −X represents a capacitive reactance.

Further, quadrants 2 and 3 represent a high impedance region as they correspond to the real resistance R that is higher than a normalized resistance represented by a center point Pc. In contrast, quadrants 1 and 4 represent a low impedance region as they correspond to the real resistance R that is lower than the nominal resistance represented by the center point Pc. The terms "inductive reactance region," "capacitive reactance region," "high impedance region," and "low impedance region," as defined herein, will be frequently referenced in various embodiments of the present disclosure, which are discussed next.

FIG. 2 is a schematic diagram of an exemplary reactance cancelling RF circuit array 10 that can be configured to enable various embodiments of the present disclosure to enable splitting-combining and reactance cancelling operations. The reactance cancelling RF circuit array 10 includes multiple (e.g., >3) RF circuits 12(1)-12(N), wherein N can be an even or an odd integer. The reactance cancelling RF circuit array 10 also includes multiple first coupling mediums 14(1)-14(M), which are denoted as "CM" and collectively referred to as at least one input medium 16. The reactance cancelling RF circuit array 10 further includes multiple second coupling mediums 18(1)-18(M), which are denoted as "CM" and collectively referred to as at least one output medium 20. In one embodiment, the at least one input medium 16 includes a single input medium and the at least one output medium 20 includes a single output medium. In another embodiment, the at least one input medium 16 includes at least one additional input medium 17 and the at least one output medium 20 includes at least one additional output medium 21. Notably, the reactance cancelling RF circuit array 10 may be implemented according to a single-dimensional (1D), a two-dimensional (2D), a three-dimensional (3D), or a higher dimensional layout without changing the operating principles disclosed herein.

As discussed in detail below, the reactance cancelling RF circuit array 10 can be configured according to various embodiments of the present disclosure to enable both the splitting-combining and the reactance cancelling operations. As such, it is possible to miniaturize the reactance cancelling RF circuit array for improved performance across a wide frequency spectrum.

The RF circuits 12(1)-12(N) are coupled between the input medium 16 and the output medium 20. In this regard, the RF circuit 12(1) is referred to as a first one of the RF circuits 12(1)-12(N) as the RF circuit 12(1) precedes each of the RF circuits 12(2)-12(N). In contrast, the RF circuit 12(N) is referred to as a last one of the RF circuits 12(1)-12(N) as the RF circuit 12(N) succeeds each of the RF circuits 12(1)-12(N−1).

In one non-limiting example, each of the RF circuits 12(1)-12(N) can be a passive RF circuit such as an RF filter, which can include a bulk acoustic wave (BAW) filter, a surface acoustic wave (SAW) filter, a crystal filter, and so on. In another non-limiting example, each of the RF circuits 12(1)-12(N) can be an active RF circuit, such as a power amplifier (e.g., push-pull power amplifier), a low-noise amplifier (LNA), and so on. It should be appreciated that the RF circuits 12(1)-12(N) can also be a combination of passive and active RF circuits.

The reactance cancelling RF circuit array 10 includes at least one signal input $S_{IN}$ and at least one signal output $S_{OUT}$, and each can be coupled to any one of the RF circuits 12(1)-12(N). The signal input $S_{IN}$ can be configured to receive an RF input signal 22 and the signal output $S_{OUT}$ can be configured to output an RF output signal 24. Notably, the RF output signal 24 can include the same content (e.g., payload) as the RF input signal 22, but change in frequency and/or power compared to the RF input signal 22.

In one aspect, the reactance cancelling RF circuit array 10 is configured to enable the splitting-combining operation. In this regard, the RF input signal 22 is first split across the RF circuits 12(1)-12(N) such that each of the RF circuits 12(1)-12(N) only receives and processes a respective portion of the RF input signal 22. In a non-limiting example, the RF input signal 22 can be split evenly such that the RF circuits 12(1)-12(N) will each receive an equal portion of the RF input signal 22. After processing (e.g., filtering, amplifying, etc.) the respective portion of the RF input signal 22, the RF circuits 12(1)-12(N) each provide the respective portion of the RF input signal 22 to the signal output $S_{OUT}$, whereat the respective portion of the RF input signal 22 received from each of the RF circuits 12(1)-12(N) is combined into the RF output signal 24.

The splitting-combining operation allows each of the RF circuits 12(1)-12(N) to be optimized for higher efficiency, lower complexity, and smaller footprint. For example, when the RF circuits 12(1)-12(N) are implemented as BAW filters, each of the RF circuits 12(1)-12(N) can only handle up to a maximum amount (e.g., 1 watt) of power. However, the RF input signal 22 may have been generated at a much higher amount (e.g., 5-20 watts or even 100 watts) of power for transmission via a massive multiple-input multiple-output (MIMO) scheme. By splitting the RF input signal 22 across the RF circuits 12(1)-12(N), it is possible for each of the RF circuits 12(1)-12(N) to resonate at a respective resonance frequency to pass the respective portion of the RF input signal 22 within power handling capability of the RF circuits 12(1)-12(N). In this regard, the splitting-combining operation can break capability bottleneck of the RF circuits 12(1)-12(N), thus helping to reduce complexity and cost of the RF circuits 12(1)-12(N).

In another example, when the RF circuits 12(1)-12(N) are implemented as power amplifiers, the power amplifier in each of the RF circuits 12(1)-12(N) will only amplify the respective portion of the RF input signal 22 and provide the amplified portion of the RF input signal 22 to the signal output Sour. Given that the power amplifier in each of the RF circuits 12(1)-12(N) only amplifies the respective portion of the RF input signal 22, the power amplifier can operate with a lower supply voltage.

In embodiments disclosed herein, the first coupling mediums 14(1)-14(M) and the second coupling mediums 18(1)-18(M) can each be a transmission line, a negative-length lumped element, and/or a positive-length lumped element. Herein, a negative-length lumped element can be an LCL-Pi network, which includes a first shunt inductor (L), a series capacitor (C), and a second shunt inductor (L), or a CLC-Tee network, which includes a first series capacitor (C), a shunt inductor (L), and a second series capacitor (C). In contrast, a positive-length lumped element can be an LCL-Tee network, which includes a first series inductor (L), a shunt capacitor (C), and a second series inductor (L), or a CLC-Pi network, which includes a first shunt capacitor (C), a series inductor (L), and a second shunt capacitor (C). Notably, the LCL-Pi network, the CLC-Tee network, the LCL-Tee network, and the CLC-Pi network are merely non-limiting examples of the negative-length lumped element and the positive-length lumped element. It should be appreciated that the negative-length lumped element and/or the positive-length lumped element may also be provided based on similar higher or lower order networks.

In an embodiment, the RF circuits 12(1)-12(N) are each coupled to a respective one or two adjacent RF circuits among the RF circuits 12(1)-12(N) via a respective one or two of the first coupling mediums 14(1)-14(M) and a respective one or two of the second coupling mediums 18(1)-18(M). For example, the RF circuit 12(1), which is the first one of the RF circuits 12(1)-12(N), is only coupled to the RF circuit 12(2) via the first coupling medium 14(1) and the second coupling medium 18(1). In contrast, the RF circuit 12(2) is coupled to the RF circuit 12(1) via the first coupling medium 14(1) and the second coupling medium 18(1), and to the RF circuit 12(3) via the first coupling medium 14(2) and the second coupling medium 18(2).

According to an embodiment of the present disclosure, the RF circuits 12(1)-12(N) are divided into one or more reactance-cancelling pairs, such as the reactance-cancelling pairs $S_{PAIR-1}$ and $S_{PAIR-2}$ as illustrated in FIG. 2. Each of the reactance-cancelling pairs $S_{PAIR-1}$ and $S_{PAIR-2}$ includes a respective pair of the RF circuits 12(1)-12(N). Notably, the pair of the RF circuits 12(1)-12(N) in each of the reactance-cancelling pairs $S_{PAIR-1}$ and $S_{PAIR-2}$ can be adjacent or non-adjacent RF circuits among the RF circuits 12(1)-12(N). For example, the reactance-cancelling pair $S_{PAIR-1}$ includes adjacent RF circuits 12(1) and 12(2), and the reactance-cancelling pair $S_{PAIR-2}$ includes non-adjacent RF circuits 12(3) and 12(N).

By coupling the pair of the RF circuits 12(1)-12(N) in each of the reactance-cancelling pairs $S_{PAIR-1}$ and $S_{PAIR-2}$ using a proper selection and/or combination of the transmission line, the negative-length lumped element, and/or the positive-length lumped element, it is possible to cause a reactance cancellation between the pair of the RF circuits 12(1)-12(N) in each of the reactance-cancelling pairs $S_{PAIR-1}$ and $S_{PAIR-2}$. Herein, a reactance-cancelling pair refers to any pair of the RF circuits 12(1)-12(N) wherein a respective reactance of one of the RF circuits in the reactance-cancelling pair can be rotated to cancel a respective reactance of another RF circuit in the reactance-cancelling pair.

FIG. 3A is a graphic diagram providing an exemplary illustration as to how reactance cancellation can be achieved between the pair of the RF circuits 12(1)-12(N) in each of the reactance-cancelling pair $S_{PAIR-1}$ and $S_{PAIR-2}$ in FIG. 2. In one example, the RF circuits 12(1) and 12(2) in the reactance-cancelling pair $S_{PAIR-1}$ each has a respective impedance $Z=R+j(-X1)$, as represented by a dot 26. According to the previous discussion in FIG. 1, each of the RF circuits 12(1) and 12(2) has a capacitive reactance $-X1$ that falls in the capacitive reactance region of the Smith Chart. Further, as illustrated, each of the RF circuits 12(1) and 12(2) has a real resistance R that lands the impedance Z in the high impedance region of the Smith Chart. To cancel the capacitive reactance $-X1$, the impedance Z of one of the RF circuits 12(1) and 12(2) (e.g., the RF circuit 12(2)) is rotated clockwise from the capacitive reactance region to the inductive reactance region to thereby transform the impedance Z from $R+j(-X1)$ to approximately $R+jX1$, as represented by a dot 26'. As a result, the capacitive reactance $-X1$ can be canceled by the inductive reactance X1 in the reactance-cancelling pair $S_{PAIR-1}$.

In another example, the RF circuits 12(3) and 12(N) in the reactance-cancelling pair $S_{PAIR-2}$ each has a respective impedance $Z=R+j(-X2)$, as represented by a dot 28. To cancel the capacitive reactance $-X2$, the impedance Z of one of the RF circuits 12(3) and 12(N) (e.g., the RF circuit 12(N)) is rotated clockwise from the capacitive reactance region to the inductive reactance region to thereby transform the impedance Z from $R+j(-X2)$ to approximately $R+jX2$, as represented by a dot 28'. As a result, the capacitive reactance $-X2$ can be canceled by the inductive reactance X2 in the reactance-cancelling pair $S_{PAIR-2}$.

As previously mentioned, the reactance cancelling RF circuit array 10 can include an even number (N=an even integer ≥3) or an odd number (N=an odd integer ≥3) of the RF circuits 12(1)-12(N). When the reactance cancelling RF circuit array 10 includes an even number of the RF circuits 12(1)-12(N), each of the RF circuits 12(1)-12(N) will belong to a respective one of the reactance-cancelling pairs (e.g., $S_{PAIR-1}$ and $S_{PAIR-2}$). However, one of the RF circuits 12(1)-12(N) (referred to as a "standalone RF circuit" for distinction) needs to be configured to have an impedance that only includes, on average, the real resistance R (Z=R), as represented by a dot 29. In this regard, the standalone RF circuit is excluded from any of the reactance-cancelling pairs (e.g., $S_{PAIR-1}$ and $S_{PAIR-2}$) as there is no reactance cancelling, per se, for the standalone RF circuit. Alternatively, it may also be said that the standalone RF circuit belongs to a special reactance-cancelling pair $S_{PAIR-SELF}$, wherein the reactance is self-cancelled.

The choice as to how the pairs of the RF circuit 12(1)-12(N) are coupled to one another in each of the reactance-cancelling pairs $S_{PAIR-1}$ and $S_{PAIR-2}$ depends on an actual number of the RF circuits 12(1)-12(N) and locations of the dots 26 and 28 on the Smith Chart, as further illustrated in FIGS. 3B-3E.

FIGS. 3B and 3C are graphic diagrams providing exemplary illustrations of a conventional method for rotating the impedance Z on the Smith Chart. As shown in FIG. 3B, the impedance Z is located in the high impedance region, and it will take approximately one-quarter (¼) of a wavelength to rotate the impedance Z, through either the low impedance region or the high impedance region, for each pair of the RF circuits 12(1)-12(N). As shown in FIG. 3C, the impedance Z is located in the low impedance region. Although it may take less than ¼ of a wavelength to rotate the impedance Z counter-in the low impedance region, it will take much longer than ¼ of a wavelength to rotate the impedance Z through the high-impedance region, which is typically more preferable.

FIGS. 3D, 3E, and 3F are graphic diagrams providing exemplary illustrations of a method of rotating the impedance Z on the Smith Chart according to embodiments of the present disclosure. As shown in FIGS. 3D and 3E, the reactance cancelling RF circuit array 10 can be configured according to various embodiments of the present disclosure to rotate the impedance Z for a large number of the RF circuits 12(1)-12(N) only in one rotation. Specifically, FIG. 3D illustrates a clockwise impedance rotation and FIG. 3E illustrates a counter-clockwise impedance rotation. When very little to no impedance shift lower, or a shift higher is desired, it is possible to place the RF circuits 12(1)-12(N) further away from the center and closer to the edge in the high impedance region of the Smith Chart. As shown in FIG. 3F, when an impedance of the reactance cancelling RF circuit array 10 is significantly lower than the respective impedance of the RF circuits 12(1)-12(N), it is possible to place the RF circuits 12(1)-12(N) in the low impedance region of the Smith Chart, with rotations being much less than one-quarter (¼) of a wavelength between each of the RF circuits 12(1)-12(N).

With reference back to FIG. 2, in an embodiment, the reactance cancelling RF circuit array 10 can further include multiple first impedance networks 30(1)-30(N) and multiple second impedance networks 32(1)-32(N). In a non-limiting example, each of the first impedance networks 30(1)-30(N) and the second impedance networks 32(1)-32(N) can be a capacitive network, an inductive network, or other type of network. The first impedance networks 30(1)-30(N) and the second impedance networks 32(1)-32(N) are each coupled to a respective one of the RF circuits 12(1)-12(N). The first impedance networks 30(1)-30(N) and the second impedance networks 32(1)-32(N) can help adjust a distance of an impedance from the center point Pc on the Smith Chart.

The reactance cancelling RF circuit array 10 in FIG. 2 can be configured according to a number of embodiments, which are now discussed in detail below. FIG. 4A is a schematic diagram of an exemplary reactance cancelling RF circuit array 10A, which is adapted from the reactance cancelling RF circuit array 10 of FIG. 2 according to an embodiment of the present disclosure. Common elements between FIGS. 2 and 4A are shown therein with common element numbers and will not be re-described herein.

For the convenience of illustration, the reactance cancelling RF circuit array 10A is shown with eight RF circuits 12(1)-12(8). It should be appreciated that the illustration herein does not constitute a limitation as to how many of the RF circuits 12(1)-12(N) can be included in the reactance cancelling RF circuit array 10.

In this embodiment, the RF circuits 12(1)-12(8) include a first RF circuit 12(1), a second RF circuit 12(2) that immediately succeeds the first RF circuit 12(1), and one or more third RF circuits 12(3)-12(8) that succeed the second RF circuit 12(2). The first coupling mediums 14(1)-14(M) include a first negative-length lumped element 14(1) and one or more first transmission lines 14(2)-14(7). Similarly, the second coupling mediums 18(1)-18(M) include a second negative-length lumped element 18(1) and one or more second transmission lines 18(2)-18(7).

In this embodiment, the first RF circuit 12(1) is coupled to the second RF circuit 12(2) via the first negative-length lumped element 14(1) and the second negative-length lumped element 18(1). The third RF circuits 12(3)-12(8) are each coupled to a respective one or two of the RF circuits 12(1)-12(8) via a respective one or two of the first transmission lines 14(3)-14(7) and a respective one or two of the second transmission lines 18(3)-18(7).

In this embodiment, the first RF circuit 12(1) and the second RF circuit 12(2) form a first reactance-cancelling pair $S_{PAIR\text{-}1}$, the third RF circuit 12(3) and the third RF circuit 12(8) form a second reactance-cancelling pair $S_{PAIR\text{-}2}$, the third RF circuit 12(4) and the third RF circuit 12(7) form a third reactance-cancelling pair $S_{PAIR\text{-}3}$, and the third RF circuit 12(5) and the third RF circuit 12(6) form a fourth reactance-cancelling pair $S_{PAIR\text{-}4}$. Herein, the first negative-length lumped element 14(1) and the second negative-length lumped element 18(1) each has a respective length of approximately one-quarter of a wavelength, while the first transmission lines 14(2)-14(7) and the second transmission lines 18(2)-18(7) each have a respective length of approximately one-tenth of the wavelength or less.

FIG. 4B is a schematic diagram of an exemplary reactance cancelling RF circuit array 10B, which is adapted from the reactance cancelling RF circuit array 10 of FIG. 2 according to another embodiment of the present disclosure. Common elements between FIGS. 2, 4A, and 4B are shown therein with common element numbers and will not be re-described herein.

In this embodiment, the first coupling mediums 14(1)-14(M) include a first positive-length lumped element 14(1) and one or more first transmission lines 14(2)-14(7). Similarly, the second coupling mediums 18(1)-18(M) include a second positive-length lumped element 18(1) and one or more second transmission lines 18(2)-18(7).

In this embodiment, the first RF circuit 12(1) is coupled to the second RF circuit 12(2) via the first positive-length lumped element 14(1) and the second positive-length lumped element 18(1). The third RF circuits 12(3)-12(8) are each coupled to a respective one or two of the RF circuits 12(1)-12(8) via a respective one or two of the first transmission lines 14(3)-14(7) and a respective one or two of the second transmission lines 18(3)-18(7).

In this embodiment, the first RF circuit 12(1) and the second RF circuit 12(2) form a first reactance-cancelling pair $S_{PAIR\text{-}1}$, the RF circuit 12(3) and the RF circuit 12(8) form a second reactance-cancelling pair $S_{PAIR\text{-}2}$, the RF circuit 12(4) and the RF circuit 12(7) form a third reactance-cancelling pair $S_{PAIR\text{-}3}$, and the RF circuit 12(5) and the RF circuit 12(6) form a fourth reactance-cancelling pair $S_{PAIR\text{-}4}$. Herein, the first negative-length lumped element 14(1) and the second negative-length lumped element 18(1) each has a respective length of approximately one-quarter of a wavelength, while the first transmission lines 14(2)-14(7) and the second transmission lines 18(2)-18(7) each have a respective length of approximately one-tenth of the wavelength or less.

FIG. 4C is a schematic diagram of an exemplary reactance cancelling RF circuit array 10C, which is adapted from the reactance cancelling RF circuit array 10 of FIG. 2 according to another embodiment of the present disclosure. Common elements between FIGS. 2 and 4A-4C are shown therein with common element numbers and will not be re-described herein.

In this embodiment, the first coupling mediums 14(1)-14(M) include one or more first transmission lines 14(1)-14(7).

Similarly, the second coupling mediums 18(1)-18(M) include one or more second transmission lines 18(1)-18(7).

In this embodiment, the RF circuits 12(1)-12(8) are each coupled to a respective one or two adjacent RF circuits among the RF circuits 12(1)-12(8) via a respective one or two of the first transmission lines 14(1)-14(7) and a respective one or two of the second transmission lines 18(1)-18(7).

In this embodiment, the RF circuit 12(1) and the RF circuit 12(8) form a first reactance-cancelling pair $S_{PAIR-1}$, the RF circuit 12(2) and the RF circuit 12(7) form a second reactance-cancelling pair $S_{PAIR-2}$, the RF circuit 12(3) and the RF circuit 12(6) form a third reactance-cancelling pair $S_{PAIR-3}$, and the RF circuit 12(4) and the RF circuit 12(5) form a fourth reactance-cancelling pair $S_{PAIR-4}$. Herein, each of the first transmission lines 14(1)-14(7) and the second transmission lines 18(1)-18(7) has a respective length of less than one-quarter of a wavelength.

Notably, the reactance cancelling RF circuit array 10A of FIG. 4A, the reactance cancelling RF circuit array 10B of FIG. 4B, and the reactance cancelling RF circuit array 10C of FIG. 4C are each adapted from the reactance cancelling RF circuit array 10 of FIG. 2 to include an even number of the RF circuits 12(1)-12(8). It should be appreciated that, the reactance cancelling RF circuit array 10 can also be adapted to include an odd number of the RF circuits 12(1)-12(N).

As an example, FIG. 4D is a schematic diagram of an exemplary reactance cancelling RF circuit array 10D, which is adapted from the reactance cancelling RF circuit array 10 of FIG. 2 according to another embodiment of the present disclosure. Common elements between FIGS. 2, 4A, and 4D are shown therein with common element numbers and will not be re-described herein.

In this embodiment, the reactance cancelling RF circuit array 10D includes the RF circuits 12(1)-12(7), the first coupling mediums 14(1)-14(M) include one or more first negative-length lumped elements 14(1)-14(6), and the second coupling mediums 18(1)-18(M) include one or more second negative-length lumped elements 18(1)-18(6).

In this embodiment, the RF circuits 12(1)-12(7) are each coupled to a respective one or two adjacent RF circuits among the RF circuits 12(1)-12(8) via a respective one or two of the first negative-length lumped elements 14(1)-14(6) and a respective one or two of the second negative-length lumped elements 18(1)-18(6).

In this embodiment, the RF circuit 12(1) and the RF circuit 12(2) form a first reactance-cancelling pair $S_{PAIR-1}$, the RF circuit 12(3) and the RF circuit 12(7) form a second reactance-cancelling pair $S_{PAIR-2}$, the RF circuit 12(4) and the RF circuit 12(6) form a third reactance-cancelling pair $S_{PAIR-3}$, and the RF circuit 12(5) is the standalone RF circuit. According to the previous discussion in FIG. 3A, the RF circuit 12(5) does not belong to any of the first reactance-cancelling pair $S_{PAIR-1}$, the second reactance-cancelling pair $S_{PAIR-2}$, and third reactance-cancelling pair $S_{PAIR-3}$. In addition, the RF circuit 12(5) is configured to have an impedance Z that includes, on average, only the real resistance (Z=R).

The reactance cancelling RF circuit array 10 of FIG. 2 can also be adapted to handle a pair of differential RF signals having an approximately 180° (e.g., 180°±37°) phase offset. In this regard, FIG. 5A is a schematic diagram of an exemplary reactance cancelling RF circuit array 10E, which is adapted from the reactance cancelling RF circuit array 10 of FIG. 2 according to another embodiment of the present disclosure to handle differential signals. Common elements between FIGS. 2 and 5A are shown therein with common element numbers and will not be re-described herein.

In this embodiment, the reactance cancelling RF circuit array 10E may optionally include a differential input coupler 34 and a differential output coupler 36. Notably, the differential input coupler 34 and the differential output coupler 36 are not needed if the RF input signal 22 is already a differential signal. The differential input coupler 34 can be coupled to any two of the RF circuits 12(1)-12(8) as long as a total length of the first coupling elements between the coupled RF circuits can provide approximately 180° (e.g., 180°±37°) phase rotation on the Smith Chart. In a non-limiting example, the differential input coupler 34 is coupled to a first one of the RF circuits 12(1)-12(8) and a last one of the RF circuits 12(1)-12(8). In this regard, a total length of the first coupling elements 14(1)-14(M) can provide approximately 180° (e.g., 180°±37°) phase rotation on the Smith Chart. The differential input coupler 34 is configured to convert the RF input signal 22 into a positive RF input signal 22P and a negative RF input signal 22N. Accordingly, the differential input coupler 34 can provide the positive RF input signal 22P and the negative RF input signal 22N to the first one of the RF circuits 12(1)-12(8) and the last one of the RF circuits 12(1)-12(8).

The differential output coupler 36 can also be coupled to any two of the RF circuits 12(1)-12(8) as long as a total length of the second coupling elements between the two RF circuits can provide approximately 180° (e.g., 180°±37°) phase rotation on the Smith Chart. In a non-limiting example, the differential output coupler 36 is also coupled to the first one of the RF circuits 12(1)-12(8) and the last one of the RF circuits 12(1)-12(8). In this regard, a total length of the coupling elements 18(1)-18(M) can provide a 180° phase rotation on the Smith Chart. The differential output coupler 36 is configured to receive a positive RF output signal 24P and a negative RF output signal 24N from the first one of the RF circuits 12(1)-12(8) and the last one of the RF circuits 12(1)-12(8). Accordingly, the differential output coupler 36 converts the positive RF output signal 24P and the negative RF output signal 24N into the RF output signal 24.

The reactance cancelling RF circuit array 10 of FIG. 2 can also be adapted to handle a pair of quadrature RF signals having approximately 90° (e.g., 90°±37°) phase offset. In this regard, FIG. 5B is a schematic diagram of an exemplary reactance cancelling RF circuit array 10F, which is adapted from the reactance cancelling RF circuit array 10 of FIG. 2 according to another embodiment of the present disclosure to handle quadrature signals. Common elements between FIGS. 2 and 5B are shown therein with common element numbers and will not be re-described herein.

In this embodiment, the reactance cancelling RF circuit array 10F may optionally include a quadrature input coupler 38 and a quadrature output coupler 40. The quadrature input coupler 38 can be coupled to any two of the RF circuits 12(1)-12(8) as long as a total length of the first coupling elements between the two RF circuits can provide approximately 90° (e.g., 90°±37°) phase rotation on the Smith Chart. In a non-limiting example, the quadrature input coupler 38 is coupled to a first one of the RF circuits 12(1)-12(8) and a last one of the RF circuits 12(1)-12(8). In this regard, a total length of the first coupling elements 14(1)-14(M) can provide a 90° phase rotation on the Smith Chart. The quadrature input coupler 38 is configured to convert the RF input signal 22 into an in-phase RF input signal 22I and a quadrature RF input signal 22Q. Accordingly, the quadrature input coupler 38 can provide the in-phase RF input signal 22I and the quadrature RF input signal 22Q to the first one of the RF circuits 12(1)-12(8) and the last one of the RF circuits 12(1)-12(8).

The quadrature output coupler 40 can be coupled to any two of the RF circuits 12(1)-12(8) as long as a total length of the second coupling elements between the two RF circuits can provide approximately 90° (e.g., 90°±37°) phase rotation on the Smith Chart. In a non-limiting example, the quadrature output coupler 40 is also coupled to the first one of the RF circuits 12(1)-12(8) and the last one of the RF circuits 12(1)-12(8). In this regard, a total length of the second coupling elements 18(1)-18(M) can provide approximately 90° (e.g., 90°±37°) phase rotation on the Smith Chart. The quadrature output coupler 40 is configured to receive an in-phase RF output signal 24I and a quadrature RF output signal 24Q from the first one of the RF circuits 12(1)-12(8) and the last one of the RF circuits 12(1)-12(8). Accordingly, the quadrature output coupler 40 converts the in-phase RF output signal 24I and the quadrature RF output signal 24Q into the RF output signal 24.

The reactance cancelling RF circuit array 10 of FIG. 2 can also be adapted to operate as a balanced-to-unbalanced (balun) device. In this regard, FIG. 5C is a schematic diagram of an exemplary reactance cancelling RF circuit array 10G, which is adapted from the reactance cancelling RF circuit array 10 of FIG. 2 according to another embodiment of the present disclosure to operate as a balun device. Common elements between FIGS. 2, 5A, and 5C are shown therein with common element numbers and will not be re-described herein.

In this embodiment, the differential input coupler 34 is coupled to a first one of the RF circuits 12(1)-12(8) and a last one of the RF circuits 12(1)-12(8). In this regard, a total length of the first coupling elements 14(1)-14(M) needs to provide a 180° phase rotation on the Smith Chart. The differential input coupler 34 is configured to convert the RF input signal 22 into a positive RF input signal 22P and a negative RF input signal 22N. Accordingly, the differential input coupler 34 can provide the positive RF input signal 22P and the negative RF input signal 22N to the first one of the RF circuits 12(1)-12(8) and the last one of the RF circuits 12(1)-12(8).

Similar to the reactance cancelling RF circuit array 10 in FIG. 2, the signal output Sour can be coupled to any of the RF circuits 12(1)-12(N) to output the RF output signal 24. However, a balance-to-unbalanced ratio can be adjusted by coupling the signal output Sour to different ones of the RF circuits 12(1)-12(N).

Notably, the reactance cancelling RF circuit array 10G in FIG. 5C is adapted from the reactance cancelling RF circuit array 10E in FIG. 5A by replacing the differential output coupler 36 with the signal output Sour. It should be appreciated that it is also possible to adapt the reactance cancelling RF circuit array 10E by replacing the differential input coupler 34 with the signal input $S_{IN}$ while keeping the differential output coupler 36.

FIG. 5D is a schematic diagram of an exemplary reactance cancelling RF circuit array 10H, which is adapted from the reactance cancelling RF circuit array of FIG. 5B according to another embodiment of the present disclosure to operate as a balun device. Common elements between FIGS. 2, 5B and 5D are shown therein with common element numbers and will not be re-described herein.

In this embodiment, the quadrature input coupler 38 is coupled to a first one of the RF circuits 12(1)-12(4) and a last one of the RF circuits 12(1)-12(4). In this regard, a total length of the first coupling elements 14(1)-14(M) needs to provide a 90° phase rotation on the Smith Chart. The quadrature input coupler 38 is configured to convert the RF input signal 22 into an in-phase RF input signal 22I and a quadrature RF input signal 22Q. Accordingly, the quadrature input coupler 38 can provide the in-phase RF input signal 22I and the quadrature RF input signal 22Q to the first one of the RF circuits 12(1)-12(4) and the last one of the RF circuits 12(1)-12(4).

Similar to the reactance cancelling RF circuit array 10 in FIG. 2, the signal output Sour can be coupled to any of the RF circuits 12(1)-12(N) to output the RF output signal 24. However, a balance-to-unbalanced ratio can be adjusted by coupling the signal output Sour to different ones of the RF circuits 12(1)-12(N).

Notably, the reactance cancelling RF circuit array 10H in FIG. 5D is adapted from the reactance cancelling RF circuit array 10F in FIG. 5B by replacing the quadrature output coupler 40 with the signal output Sour. It should be appreciated that it is also possible to adapt the reactance cancelling RF circuit array 10F by replacing the quadrature input coupler 38 with the signal input $S_{IN}$ while keeping the quadrature output coupler 40.

The reactance cancelling RF circuit array 10 of FIG. 2 can also be adapted to operate as an unbalanced-to-unbalanced transformer. In this regard, FIG. 5E is a schematic diagram of an exemplary reactance cancelling RF circuit array 10I, which is adapted from the reactance cancelling RF circuit array 10 of FIG. 2 according to another embodiment of the present disclosure to operate as an unbalanced-to-unbalanced transformer. Common elements between FIGS. 2 and 5E are shown therein with common element numbers and will not be re-described herein.

In this embodiment, as a non-limiting example, the reactance cancelling RF circuit array 10I includes three RF circuits 12(1)-12(3), two first coupling mediums 14(1), 14(2), and two second coupling mediums 18(1), 18(2). The RF circuit 12(1) is coupled to the RF circuit 12(2) via the first coupling medium 14(1) and the second coupling medium 18(1), which are both negative-length lumped elements. The RF circuit 12(2) is coupled to the RF circuit 12(3) via the first coupling medium 14(2) and the second coupling medium 18(2), which are both positive-length lumped elements. The signal input $S_{IN}$ is coupled to the RF circuit 12(1), which is the first one of the RF circuits 12(1)-12(3), and the signal output Sour is coupled to the RF circuit 12(3), which is the last one of the RF circuits 12(1)-12(3).

The reactance cancelling RF circuit array 10 of FIG. 2 can be further adapted to provide a reactance cancelling splitter array. In this regard, FIG. 6 is a schematic diagram of an exemplary reactance cancelling splitter array 42, which is adapted from the reactance cancelling RF circuit array 10 of FIG. 2 in accordance with an embodiment of the present disclosure. Common elements between FIGS. 2 and 6 are shown therein with common element numbers and will not be re-described herein.

In an embodiment, the reactance cancelling splitter array 42 is created by removing and replacing the output medium 20 in FIG. 2 with multiple signal outputs $S_{OUT-1}$-$S_{OUT-N}$. Each of the signal outputs $S_{OUT-1}$-$S_{OUT-N}$ is coupled to a respective one of the RF circuits 12(1)-12(N). As previously discussed in FIG. 2, the RF circuits 12(1)-12(N) each receive a respective portion of the RF input signal 22. In this regard, the RF circuits 12(1)-12(N) are each configured to output the respective portion of the RF input signal 22 as a respective one of multiple RF output signals 44(1)-44(N) via a respective one of the signal outputs $S_{OUT-1}$-$S_{OUT-N}$.

The reactance cancelling RF circuit array 10 of FIG. 2 can also be adapted to provide a reactance cancelling combiner array. In this regard, FIG. 7 is a schematic diagram of an exemplary reactance cancelling combiner array 46, which is adapted from the reactance cancelling RF circuit array 10 of FIG. 2 in accordance with an embodiment of the present disclosure. Common elements between FIGS. 2 and 7 are shown therein with common element numbers and will not be re-described herein.

In an embodiment, the reactance cancelling combiner array 46 is created by removing and replacing the input medium 16 in FIG. 2 with multiple signal inputs $S_{IN-1}$-$S_{IN-N}$. Each of the signal inputs $S_{IN-1}$-$S_{IN-N}$ is coupled to a respective one of the RF circuits 12(1)-12(N). In this regard, the RF circuits 12(1)-12(N) each receives a respective one of multiple RF input signals 48(1)-48(N) via a respective one of the signal inputs $S_{IN-1}$-$S_{IN-N}$. Accordingly, the RF circuits 12(1)-12(N) are each configured to provide the respective one of the multiple RF input signals 48(1)-48(N) to the signal output Sour, whereat the RF input signals 48(1)-48(N) are combined into the RF output signal 24.

In an embodiment, it is also possible to create a reactance cancelling RF circuit arrays network based on the reactance cancelling RF circuit array 10 of FIG. 2. In this regard, FIG. 8 is a schematic diagram of an exemplary reactance cancelling RF circuit array network 50 incorporating the reactance cancelling RF circuit array 10 of FIG. 2.

The reactance cancelling RF circuit array network 50 includes multiple reactance cancelling RF circuit arrays 52(1)-52(L). Each of the reactance cancelling RF circuit arrays 52(1)-52(L) is identical to the reactance cancelling RF circuit array 10 of FIG. 2. The reactance cancelling RF circuit arrays 52(1)-52(L) are coupled between an input medium 54, which includes multiple input coupling elements 56(1)-56(K), and an output medium 58, which includes multiple output coupling elements 60(1)-60(K). Accordingly, the reactance cancelling RF circuit arrays 52(1)-52(L) are each coupled to a respective one or two of the input coupling elements 56(1)-56(K) and a respective one or two of the output coupling elements 60(1)-60(K). Like the first coupling mediums 14(1)-14(M) and the second coupling mediums 18(1)-18(M) in FIG. 2, the input coupling elements 56(1)-56(K) and the output coupling elements 60(1)-60(K) can also be transmission lines, negative-length lumped elements, positive-length lumped elements, or combinations therewith.

Those skilled in the art will recognize improvements and modifications to the preferred embodiments of the present disclosure. All such improvements and modifications are considered within the scope of the concepts disclosed herein and the claims that follow.

What is claimed is:

1. A reactance cancelling radio frequency (RF) circuit array comprising:
   an input medium comprising a plurality of first coupling mediums configured to split an RF signal into a plurality of RF output signals each comprising a respective portion of the RF signal;
   a plurality of signal outputs each configured to output a respective one of the RF output signals; and
   a plurality of RF circuits each provided between the input medium and a respective one of the plurality of signal outputs and configured to provide the respective one of the plurality of RF output signals to the respective one of the plurality of signal outputs; wherein:
      each of the plurality of RF circuits is coupled to a respective one or two adjacent RF circuits among the plurality of RF circuits via a respective one or two of the plurality of first coupling mediums to thereby divide the plurality of RF circuits into one or more reactance-cancelling pairs each comprising a pair of the plurality of RF circuits; and
      the plurality of first coupling mediums is configured to cause a reactance cancellation between the pair of the plurality of RF circuits in each of the one or more reactance-cancelling pairs.

2. The reactance cancelling RF circuit array of claim 1, wherein the input medium is further configured to split the RF signal into the plurality of RF output signals each comprising an equal portion of the RF signal.

3. A reactance cancelling radio frequency (RF) circuit array comprising:
   an output medium comprising a plurality of second coupling mediums configured to combine a plurality of RF input signals each comprising a respective portion of an RF signal into an RF output signal and output the RF output signal via a signal output;
   a plurality of signal inputs each configured to receive a respective one of the RF input signals; and
   a plurality of RF circuits each provided between a respective one of the plurality of signal inputs and the output medium and configured to provide the respective one of the RF input signals to the output medium; wherein:
      each of the plurality of RF circuits each is coupled to a respective one or two adjacent RF circuits among the plurality of RF circuits via a respective one or two of the plurality of second coupling mediums to thereby divide the plurality of RF circuits into one or more reactance-cancelling pairs each comprising a pair of the plurality of RF circuits; and
      the plurality of second coupling mediums is configured to cause a reactance cancellation between the pair of the plurality of RF circuits in each of the one or more reactance-cancelling pairs.

4. The reactance cancelling RF circuit array of claim 3, wherein each of the plurality of RF input signals comprises an equal portion of the RF signal.

5. A wireless device comprising a reactance cancelling radio frequency (RF) circuit array, the reactance cancelling RF circuit array comprises:
   an input medium comprising a plurality of first coupling mediums configured to split an RF signal into a plurality of RF output signals each comprising a respective portion of the RF signal;
   a plurality of signal outputs each configured to output a respective one of the RF output signals; and
   a plurality of RF circuits each provided between the input medium and a respective one of the plurality of signal outputs and configured to provide the respective one of the plurality of RF output signals to the respective one of the plurality of signal outputs; wherein:
      each of the plurality of RF circuits is coupled to a respective one or two adjacent RF circuits among the plurality of RF circuits via a respective one or two of the plurality of first coupling mediums to thereby divide the plurality of RF circuits into one or more reactance-cancelling pairs each comprising a pair of the plurality of RF circuits; and
      the plurality of first coupling mediums is configured to cause a reactance cancellation between the pair of the plurality of RF circuits in each of the one or more reactance-cancelling pairs.

6. A wireless device comprising a reactance cancelling radio frequency (RF) circuit array, the reactance cancelling RF circuit array comprises:
- an output medium comprising a plurality of second coupling mediums configured to combine a plurality of RF input signals each comprising a respective portion of an RF signal into an RF output signal and output the RF output signal via a signal output;
- a plurality of signal inputs each configured to receive a respective one of the RF input signals; and
- a plurality of RF circuits each provided between a respective one of the plurality of signal inputs and the output medium and configured to provide the respective one of the RF input signals to the output medium; wherein:
    - each of the plurality of RF circuits is coupled to a respective one or two adjacent RF circuits among the plurality of RF circuits via a respective one or two of the plurality of second coupling mediums to thereby divide the plurality of RF circuits into one or more reactance-cancelling pairs each comprising a pair of the plurality of RF circuits; and
    - the plurality of second coupling mediums is configured to cause a reactance cancellation between the pair of the plurality of RF circuits in each of the one or more reactance-cancelling pairs.

* * * * *

UNITED STATES PATENT AND TRADEMARK OFFICE
CERTIFICATE OF CORRECTION

PATENT NO. : 12,230,895 B2
APPLICATION NO. : 18/312083
DATED : February 18, 2025
INVENTOR(S) : Kelly M. Lear et al.

It is certified that error appears in the above-identified patent and that said Letters Patent is hereby corrected as shown below:

In the Specification

In Column 6, Line 33, replace "Sour" with --$S_{OUT}$--.

In Column 6, Line 36, replace "Sour" with --$S_{OUT}$--.

In Column 7, Line 12, replace "Sour" with --$S_{OUT}$--.

In Column 12, Line 65, replace "signal 221" with --signal 22I--.

In Column 12, Line 67, replace "signal 221" with --signal 22I--.

In Column 13, Line 14, replace "signal 241" with --signal 24I--.

In Column 13, Line 18, replace "signal 241" with --signal 24I--.

In Column 13, Line 46, replace "Sour" with --$S_{OUT}$--.

In Column 13, Line 51, replace "Sour" with --$S_{OUT}$--.

In Column 14, Line 2, replace "signal 221" with --signal 22I--.

In Column 14, Line 5, replace "221" with --22I--.

In Column 14, Line 9, replace "Sour" with --$S_{OUT}$--.

In Column 14, Line 45, replace "Sour" with --$S_{OUT}$--.

In Column 15, Line 20, replace "Sour" with --$S_{OUT}$--.

Signed and Sealed this
Sixteenth Day of September, 2025

Coke Morgan Stewart
*Acting Director of the United States Patent and Trademark Office*

CERTIFICATE OF CORRECTION (continued)
U.S. Pat. No. 12,230,895 B2

In the Claims

In Column 16, Line 28, replace "plurality of RF circuits each" with --plurality of RF circuits--.